(12) United States Patent
Iwai et al.

(10) Patent No.: US 8,749,979 B2
(45) Date of Patent: Jun. 10, 2014

(54) SHEET STRUCTURE AND METHOD OF MANUFACTURING SHEET STRUCTURE

(75) Inventors: Taisuke Iwai, Kawasaki (JP); Daiyu Kondo, Kawasaki (JP); Yoshitaka Yamaguchi, Kawasaki (JP); Ikuo Soga, Kawasaki (JP); Shinichi Hirose, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/405,578

(22) Filed: Mar. 17, 2009

(65) Prior Publication Data

US 2009/0237886 A1   Sep. 24, 2009

(30) Foreign Application Priority Data

Mar. 18, 2008  (JP) ................................ 2008-068992
Oct. 27, 2008  (JP) ................................ 2008-275338

(51) Int. Cl.
*H05K 7/20*   (2006.01)

(52) U.S. Cl.
USPC ............................ 361/710; 361/705; 361/708

(58) Field of Classification Search
USPC ........................................ 361/688, 704–722
See application file for complete search history.

(56) References Cited

U.S. PATENT DOCUMENTS

| | | | |
|---|---|---|---|
| 4,234,638 A * | 11/1980 | Yamazoe et al. | 428/133 |
| 5,660,917 A * | 8/1997 | Fujimori et al. | 428/195.1 |
| 6,630,772 B1 | 10/2003 | Bower et al. | |
| 6,837,273 B2 | 1/2005 | Woolstencroft et al. | |
| 6,965,513 B2 | 11/2005 | Montgomery et al. | |
| 6,994,155 B2 * | 2/2006 | Dessiatoun et al. | 165/165 |
| 7,077,858 B2 * | 7/2006 | Fletcher et al. | 607/104 |
| 7,168,484 B2 * | 1/2007 | Zhang et al. | 165/185 |
| 7,176,502 B2 * | 2/2007 | Mazzochette et al. | 257/99 |
| 7,279,916 B2 | 10/2007 | Suhir | |
| 7,393,428 B2 | 7/2008 | Huang et al. | |
| 7,459,112 B2 * | 12/2008 | Chu et al. | 264/160 |
| 7,736,615 B2 | 6/2010 | Kawabata et al. | |
| 7,742,673 B2 * | 6/2010 | Li et al. | 385/129 |
| 2004/0265489 A1 * | 12/2004 | Dubin | 427/212 |
| 2005/0087726 A1 | 4/2005 | Anazawa et al. | |
| 2006/0231946 A1 | 10/2006 | Pan et al. | |
| 2006/0234056 A1 * | 10/2006 | Huang et al. | 428/408 |
| 2007/0004081 A1 * | 1/2007 | Hsiao | 438/106 |
| 2007/0139895 A1 * | 6/2007 | Reis et al. | 361/719 |
| 2007/0244245 A1 * | 10/2007 | Liu et al. | 524/496 |
| 2010/0243227 A1 * | 9/2010 | Wu et al. | 165/185 |

FOREIGN PATENT DOCUMENTS

| | | | |
|---|---|---|---|
| JP | 2000141056 A | 5/2000 |
| JP | 2002-141633 A | 5/2002 |

(Continued)

OTHER PUBLICATIONS

"Chinese Office Action", mailed by Chinese Patent Office and corresponding to Chinese application No. 200910128024.4 on Aug. 4, 2010, with English translation.

(Continued)

*Primary Examiner* — Courtney Smith

(74) *Attorney, Agent, or Firm* — Fujitsu Patent Center

(57) ABSTRACT

The sheet structure includes a plurality of linear structures of carbon atoms, a filling layer filled in gaps between the linear structures for supporting the plurality of linear structures, and a coating film formed over at least one ends of the plurality of linear structures and having a thermal conductivity of not less than 1 W/m·K.

19 Claims, 22 Drawing Sheets

(56) References Cited

FOREIGN PATENT DOCUMENTS

| | | |
|---|---|---|
| JP | 2005-150362 A | 6/2005 |
| JP | 2005154887 A | 6/2005 |
| JP | 2006-147801 A | 6/2006 |
| JP | 2006-270041 | 10/2006 |
| JP | 2006-303240 A | 11/2006 |
| JP | 2007-009213 A | 1/2007 |
| JP | 2007-76925 A | 3/2007 |
| JP | 2007-284679 A | 11/2007 |
| JP | 2008-34474 A | 2/2008 |
| WO | WO 2007/111107 | 10/2007 |

OTHER PUBLICATIONS

"Extended European Search Report", mailed by EPO and corresponding to European application No. 09155530.0 on Sep. 23, 2010.

"Korean Official Action", mailed by KPO and corresponding to Korean application No. 10-2009-0021322 on Jan. 17, 2011, with English translation.

Japanese Office Action mailed Jul. 16, 2013 for corresponding Japanese Application No. 2012-201242, with Partial English-language Translation.

Office Action mailed Oct. 1, 2013 by the JPO in connection with Japanese Patent Application No. 2012-201242; Translation included.

* cited by examiner

SHEET STRUCTURE AND METHOD OF MANUFACTURING SHEET STRUCTURE

CROSS REFERENCE TO RELATED APPLICATIONS

This application is based upon and claims the benefit of priorities from the prior Japanese Patent Application No. 2008-068992, filed on Mar. 18, 2008, and the prior Japanese Patent Application No. 2008-275338, filed on Oct. 27, 2008, the entire contents of which are incorporated herein by reference.

FIELD

The embodiments discussed herein are related to a sheet structure and a method of manufacturing a sheet structure, more specifically, a sheet structure including linear structure of carbon atoms and a method of manufacturing the sheet structure, and an electronic device using such sheet structure and method of manufacturing the electronic device.

BACKGROUND

The electronic parts used in the CPUs (Central Processing Units), etc. of servers, personal computers, etc. are needed to have high radiation efficiency of heat generated by semiconductor elements. For the effective radiation of the heat generated in the semiconductor elements, the structure that a heat spreader made of a material of a high specific thermal conductivity, such as copper or another, is disposed over the semiconductor element with a thermal conductive sheet, such as indium sheet or another, disposed immediately above the semiconductor element interposed therebetween.

However, due the recent large demand increase of rare metals, the price of indium has gone up, and substitute materials which are less expensive than indium are expected. In terms of the physical properties, it cannot be said that the specific thermal conductivity of indium (50 W/m·K) is high. To more effectively radiate the heat generated by the semiconductor elements, materials of higher thermal conductivities are expected.

In such background, as a material whose thermal conductivity is higher than indium, the linear structure of carbon atoms, which is typically the carbon nanotube is noted. The carbon nanotube not only has a very high thermal conductivity (1500 W/m·K) but also is superior in flexibility and heat resistance, and has high potential as a heat radiation material.

As the thermal conductive sheets using carbon nanotubes, a thermal conductive sheet including carbon nanotubes dispersed in a resin, a thermal conductive sheet including carbon nanotube bundles orientationally grown on a substrate, which are buried with a resin, etc. are proposed.

The following are examples of related art of the present invention: Japanese Laid-open Patent Publication No. 2005-150362, Japanese Laid-open Patent Publication No. 2006-147801, and Japanese Laid-open Patent Publication No. 2006-303240.

However, in the proposed thermal conductive sheets, the higher thermal conductivity of the carbon nanotube cannot be sufficiently utilized.

SUMMARY

According to one aspect of an embodiment, there is provided a sheet structure including a plurality of linear structures of carbon atoms, a filling layer filled in gaps between the plurality of linear structures and supporting the plurality of linear structures, and a first coating film formed on at least one ends of the plurality of linear structures and formed of a material having higher thermal conductivity than a constituent material of the filling layer.

According to another aspect of an embodiment, there is provided a sheet structure including a plurality of linear structures of carbon atoms, and a first coating film formed on at least one ends of the plurality of linear structures, and formed of a material having a higher heat conductivity of not less than 1 W/m·K and joining the linear structures neighboring each other.

According to further another aspect of an embodiment, there is provided an electronic instrument including a heat generator, a heat radiator for radiating heat generating from the heat generator, and a sheet structure arranged between the heat generator and the heat radiator, and including a plurality of linear structures of carbon atoms and a first coating film formed on at least one ends of the plurality of linear structures.

The object and advantages of the embodiment will be realized and attained by means of the elements and combinations particularly pointed out in the claims.

It is to be understood that both the foregoing general description and the following detailed description are exemplary and explanatory and are not restrictive of the embodiments, as claimed.

DESCRIPTION OF EMBODIMENTS

A First Embodiment

The carbon nanotube sheet and the method of manufacturing the same according to a first embodiment will be explained with reference to FIGS. 1 to 7.

Figure 1:
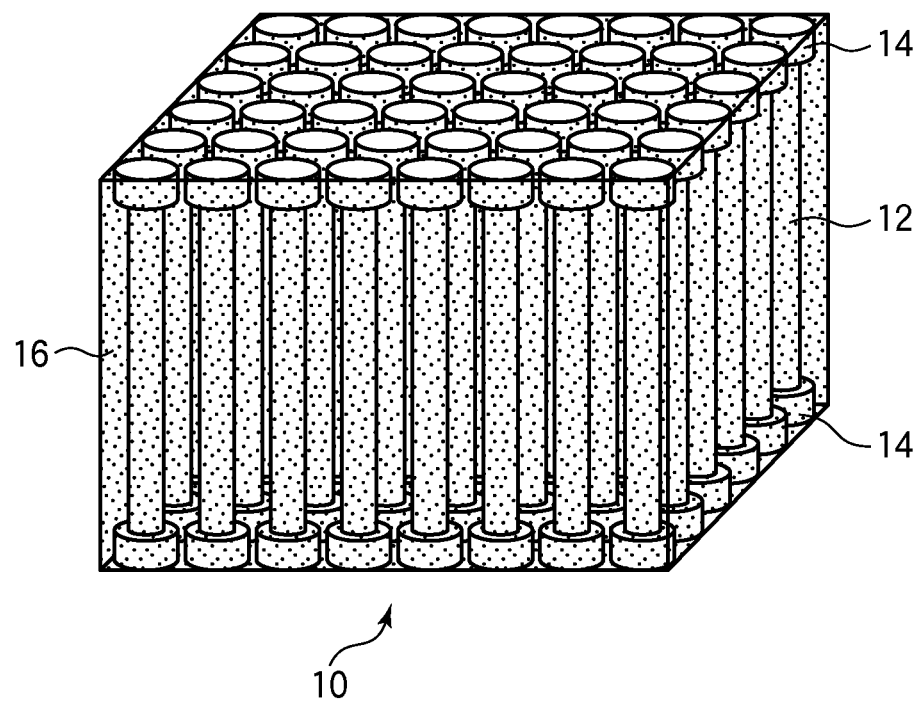
FIG. 1 is a perspective view illustrating a structure of the carbon nanotube sheet according to a first embodiment.
Figure 2:
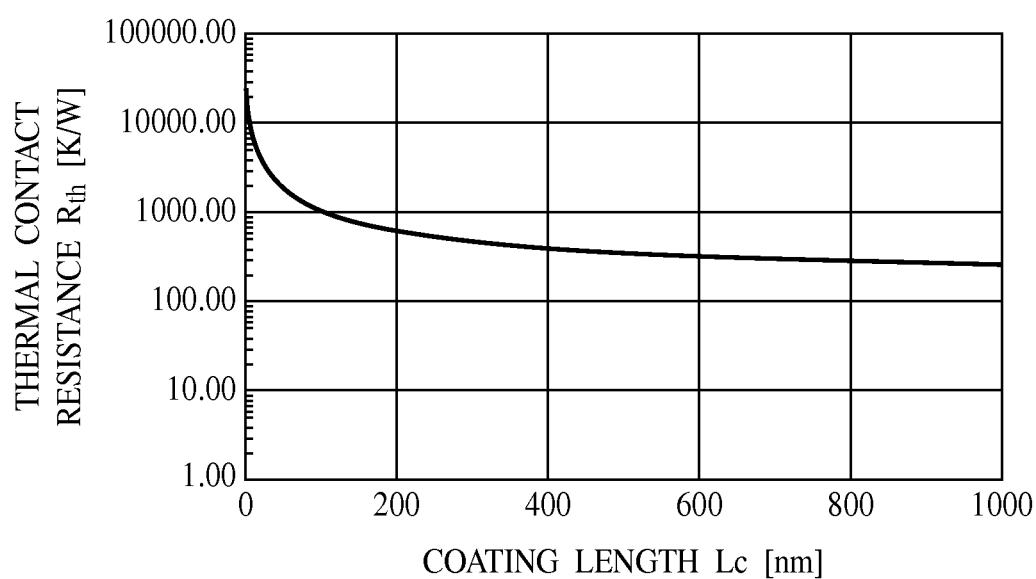
FIG. 2 is a graph illustrating a relationship between the thermal contact resistance and the coating length of the coating film given by simulation.
Figure 3:
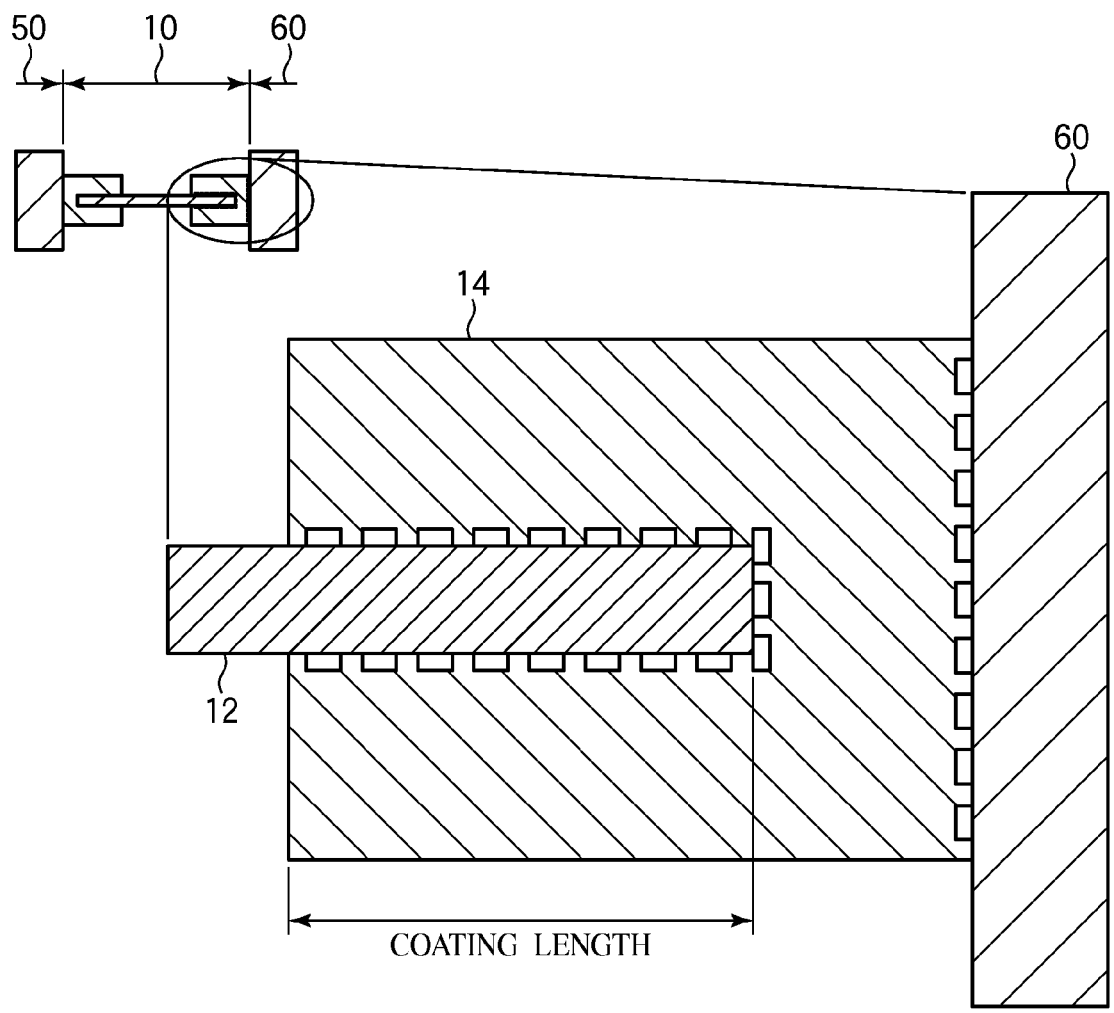
FIG. 3 is a schematic view illustrating a condition of a heat generator and a heat radiator connected to each other via the carbon nanotube sheet.

FIG. 1 is a perspective view illustrating a structure of the carbon nanotube sheet according to the present embodiment. FIG. 2 is a graph illustrating a relationship between the thermal contact resistance and the coating length of the coating film given by simulation. FIG. 3 is a schematic view illustrating a condition of a heat generator and a heat radiator connected to each other via the carbon nanotube sheet. FIGS. 4A-4B, 5A-5B, 6A-6B and 7 are perspective views illustrating a method of manufacturing the carbon nanotube sheet according to the present embodiment.

First, the structure of the carbon nanotube sheet according to the present embodiment will be explained with reference to FIG. 1.

The carbon nanotube sheet 10 according to the present embodiment has the structure that, as illustrated in FIG. 1, a plurality of carbon nanotubes 12 having both ends coated with coating films 14 of a thermal conductive and/or electric conductive material are buried in a filling layer 16 of a resin material, a metal material or others.

The carbon nanotubes 12 are oriented vertically to the surface of the sheet. The carbon nanotubes 12 may be either of single-walled carbon nanotubes or multi-walled carbon nanotubes. The density of the carbon nanotubes 12 is not especially limited but can be set preferably at not less than about $1 \times 10^{10}$ tubes/cm$^2$ from the view point of heat radiation and electric conduction. The length of the carbon nanotubes 12 is decided by applications of the carbon nanotube sheet 10. It is not especially limited but can be set preferably at a value of about 5-500 µm.

The coating films 14 provided on the ends of the carbon nanotubes 12 are not specifically limited as long as the coating films 14 are formed of a material of high thermal conductivity. In terms of improving the thermal conductivity of the carbon nanotube sheet 10 as a whole, it is preferable to form the coating films 14 of a material of higher thermal conductivity than that of a material of the filling layer 16. In view of the thermal conductivity of about 0.1 (W/m·K) of the general resin materials, it is effective that the coating films 14 formed on both surfaces of the carbon nanotube sheet 10 are formed of a material of high thermal conductivity, e.g., not less than 1 (W/m·K). When the carbon nanotube sheet 10 is used for electric conductive applications, conductive materials, e.g., metals, alloys, etc. can be used. As materials forming the coating films 14, copper (Cu), nickel (Ni), gold (Au), indium (In), low melting point solder, etc., for example, can be used. The coating films 14 may not essentially have a single layer structure and may have a multilayer structure of two, three or more layers, e.g., a multilayer structure of titanium (Ti) and gold (Au).

By providing the coating films 14 of high thermal conductivity on the ends of the carbon nanotubes 12, the contact area of the carbon nanotube sheet 10 with respect to a mounted body 8 (a heat radiator or a heat generator) can be increased in comparison with that given without the coating films 14. Thus, the thermal contact resistance between the carbon nanotube sheet 12 and the mounted body can be decreased, and the thermal conductivity of the carbon nanotube sheet 10 can be increased.

The coating film 14 of a material of low melting point, e.g., indium (melting point: about 157° C.) or a low melting point solder is used to thereby cause the coating films 14 to reflow after the carbon nanotube sheet 10 has been brought into contact with the mounted body. Thus, the concavities and convexities of the contact portions between the carbon nanotube sheet 10 and the mounted body can be filled with the constituent material of the coating films 14, whereby the thermal conductivity and the electric conductivity between them can be further improved.

FIG. 2 is a graph illustrating the relationships between the thermal contact resistance and the coating length of the coating film 14 given by simulation. On the horizontal axis, the coating length Lc of the coating film 14 is taken, and the thermal contact resistance $R_{th}$ is taken on the vertical axis.

FIG. 3 is a schematic view which illustrates a heat generator 50 and a heat radiator 60 connected to each other via the carbon nanotube sheet 10. In FIG. 3, the carbon nanotube sheet 10 is represented by one carbon nanotube 12. The coating films 14 are formed covering the end regions of the carbon nanotube 12. As illustrated in FIG. 3, the coating length Lc of the coating film 14 is a length of a region of the carbon nanotube 12 covered by the coating film 14.

In the simulation of FIG. 2, it was assumed that carbon nanotubes 12 of a 1000 W/m·K thermal conductivity and a 100 µm-length were formed in a $1 \times 10^{11}$ tubes/cm$^2$ density. It was also assumed that 30% of the contact area between the coating film 14 of gold and the carbon nanotubes 12 contributed to the heat conduction.

As shown in FIG. 2, the thermal contact resistance of the carbon nanotube 12 is lower as the coating length of the coating film 14 is larger. Especially when the coating length Lc of the coating film 14 is not more than 100 nm, the change of the thermal contact resistance with respect to the coating length Lc is very large, and with the containing of not less than tens nm, the thermal contact resistance decreases by one placement or more.

When the carbon nanotubes 12 are grown in a density of about $1 \times 10^{11}$ tubes/cm$^2$, the coating length Lc is about three times a film thickness of the film deposited on the end surfaces of the carbon nanotubes 12.

When the carbon nanotubes 12 are grown in a density of about $1 \times 10^{11}$ tubes/cm$^2$, the gap between the carbon nanotubes 12 is about 30-50 nm. In this case, when the film thickness of the coating film 12 deposited on the end surfaces of the carbon nanotubes 12 is set at not less than about 100 nm, the coating film 14 formed on the neighboring carbon nanotubes 12 comes into contact with each other, and the coating film 14 is formed continuous on the surfaces of the carbon nanotube sheet 10.

The film thickness of the coating film 14 can be set suitably in accordance with required characteristics of the carbon nanotube sheet 10.

The minimum film thickness of the coating film 14 can be given in terms of the thermal contact resistance described above. For example, when the carbon nanotubes 12 are grown in a density of about $1 \times 10^{11}$ tubes/cm$^2$, it is preferable that the film thickness of the coating films 14 is not less than about 30 nm (the coating length Lc is not less than about 100 nm). Thus, the thermal contact resistance can be improved by one placement or more in comparison with that given without the coating film 14.

The maximum film thickness of the coating film 14 can be given in terms of a required thermal conductivity of the carbon nanotube sheet 10. When the coating film 14 is formed of gold, whose thermal conductivity is about 300 W/m·K which is about ⅟₁₀ of the thermal conductivity of the carbon nanotubes 12, there is a risk that the coating film 14 formed too thick might decrease the thermal conductivity of the carbon nanotube sheet 10 as a whole.

Whether the neighboring carbon nanotubes 12 are connected to each other by the coating film 14 can be selected depending on applications of the carbon nanotube sheet 10.

When the neighboring carbon nanotubes 12 are connected to each other by the coating film 14, each of the carbon nanotubes 12 are independent of each other, and have high flexibility. Accordingly, the flexibility of the carbon nanotubes 12 upon their contact with the mounted body can be improved.

On the other hand, with the neighboring carbon nanotubes 12 connected to each other by the coating film 14, even when some of carbon nanotubes 12 are not in direct contact with the mounted body because of disuniform length of the carbon nanotubes 12, the transverse heat conduction and electric conduction via the coating film 14 makes it possible to use all the carbon nanotubes 12 as heat conductors, and the heat conduction can be improved.

In the carbon nanotube sheet 10 according to the present embodiment, the surface of the coating film 14 is covered by no filling layer 16. Accordingly, when the carbon nanotube sheet 10 is in contact with a heat radiator or a heat generator, the carbon nanotubes 12 are in direct contact with the heat radiator or the heat generator, and the thermal conductive efficiency can be much improved.

Because of the electric conductivity of the carbon nanotubes 12, the coating film 14 is formed of an electric conductive material, whereby the carbon nanotubes 12 can be used also as interconnections passing through the sheet. That is, the carbon nanotube sheet 10 can be used not only as a heat conductive sheet, but also as a vertical interconnecting sheet. When the carbon nanotube sheet 10 is used as an interconnecting sheet, the contact resistance between the carbon nanotubes 12 and a mounted body is decreased, and the electric conductivity of the carbon nanotube sheet 10 can be increased.

The constituent material of the filling layer 16 is not especially limited as long as the material has the property that the material is liquid when filling the spaces between the carbon nanotubes and can be hardened later. To give examples, as the organic filling materials, acryl resin, epoxy resin, silicone resin, polyimide resin, etc. can be used. As the inorganic filling materials, insulating film forming compositions by using spin coating, such as SOG (Spin On Glass), etc., can be used. Metal materials, such as indium, solder, metal pastes (e.g., silver paste), etc., can be also used. Conductive polymers, such as polyaniline, polythiophene, etc., can be used. When the carbon nanotube sheet 10 having an elasticity or flexibility is formed, a filling material which becomes rubber-like or gelled after solidified may be used.

In the filling layer 16, additives may be mixed dispersed as required. As the additives, for example, substances of high thermal conductivity and substances of high electric conductivity are considered. Additives of high thermal conductivity are mixed dispersed in the filling layer 16 portion, whereby the thermal conductivity of the filling layer 16 portion can be improved, and the thermal conductivity of the carbon nanotube sheet 10 as a whole can be improved. When the carbon nanotube sheet is used as an electric conductive sheet, an additive of high electric conductivity is mixed dispersed in the filling payer 16 portion, whereby the electric conductivity of the carbon nanotube sheet 10 as a whole can be improved. This is effective especially when the filling layer 16 is formed of an insulating material of low thermal conductivity, such as an organic filling material or others. As material of high thermal conductivity, carbon nanotubes, metal material, aluminum nitride, silica, alumina, graphite fullerene, etc. can be used. As materials of high electric conductivity, carbon nanotubes, metal materials, etc. can be used.

Next the method of manufacturing the carbon nanotube sheet according to the present embodiment will be explained with reference to FIGS. 4A to 7.

First, a substrate 30 to be used as the base for forming the carbon nanotube sheet 10 is prepared. As the substrate 30, a semiconductor substrate, such as a silicon substrate or others, an alumina (sapphire) substrate, an MgO substrate, a glass substrate or others can be used. Thin film may be formed on these substrates. For example, a silicon substrate with an about 300 nm-thickness silicon oxide film formed on can be used.

The substrate 30 is removed after the carbon nanotubes 12 have been formed. To this end, it is preferable that at least the surface of the substrate 30 is formed of a material which is easily peeled from the carbon nanotubes 12 or a material which is capable of being etched selectively with respect to the carbon nanotube sheet 10.

Figure 4A:
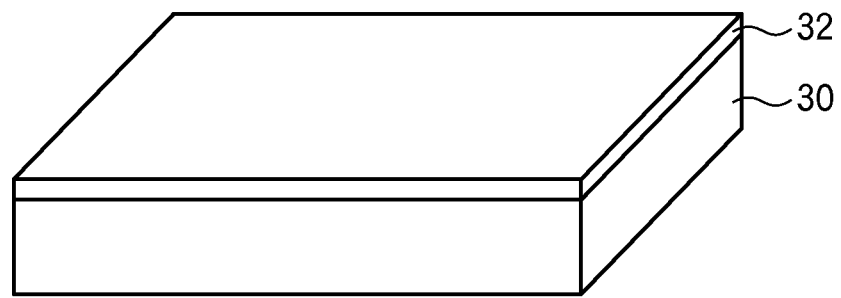
FIGS. 4A-4B, 5A-5B, 6A-6B and 7 are perspective views illustrating a method of manufacturing the carbon nanotube sheet according to the first embodiment.

Then, on the substrate 30, a 2.5 nm-thickness Fe (iron) film, for example, is formed by, e.g., sputtering method to form a catalyst metal film 32 of Fe (FIG. 4A).

As the catalyst metal, other than Fe, Co (cobalt), Ni (nickel), Au (gold), Ag (silver), Pt (platinum) or an alloy containing at least one of these materials may be used. As the catalyst, other than the metal film, metal particles having the size controlled in advance by a DMA (Differential Mobility Analyzer) or others may be used. In this case as well, the metal species may be the same as those of the thin film.

As the base film of these catalyst metals, film of Mo (molybdenum), Ti (titanium), Hf (hafnium), Zr (zirconium), Nb (niobium), V (vanadium), TaN (tantalum nitride), TiSi$_x$ (titanium silicide), Al (aluminum), Al$_2$O$_3$ (aluminum oxide), TiO$_x$ (titanium oxide), Ta (tantalum), W (tungsten), Cu (copper), Au (gold), Pt (platinum), Pd (palladium), TiN (titanium nitride) or an alloy containing at least one of these materials may be used. For example, the layer structure of the Fe (2.5 nm)/Al (10 nm), the layer structure of Co (2.6 nm)/TiN (5 nm), etc. can be used. When the metal particles are used, the layer structures of, e.g., Co (average diameter: 3.8 nm)/TiN (5 nm), etc. can be used.

Then, over the substrate 30, by, e.g., hot filament CVD method, the carbon nanotubes are grown with the catalyst metal film 32 as the catalyst. The conditions for growing the carbon nanotubes are, e.g., the mixed gas of acetylene/argon (partial pressure ratio: 1:9) as the raw material gas, 1 kPa of the total gas pressure in the film forming chamber, 1000° C. of the hot filament temperature and 20 minutes of the growth period of time. Thus, a multi-walled carbon nanotubes of a wall number of 3-6 walls (about average 4 walls), a 4-8 nm diameter (average 6 nm) and a 80 μm-length (growth rate: 4 μm/min) can be grown. The carbon nanotubes may be formed by processes other than hot filament CVD method, e.g., thermal CVD method, remote plasma CVD method, etc. The carbon nanotubes to be grown can be single-walled carbon nanotubes. As the carbon raw material, other than acetylene, hydrocarbons of methane, ethylene, etc. alcohols of ethanol, methanol, etc. may be used.

Figure 4B:
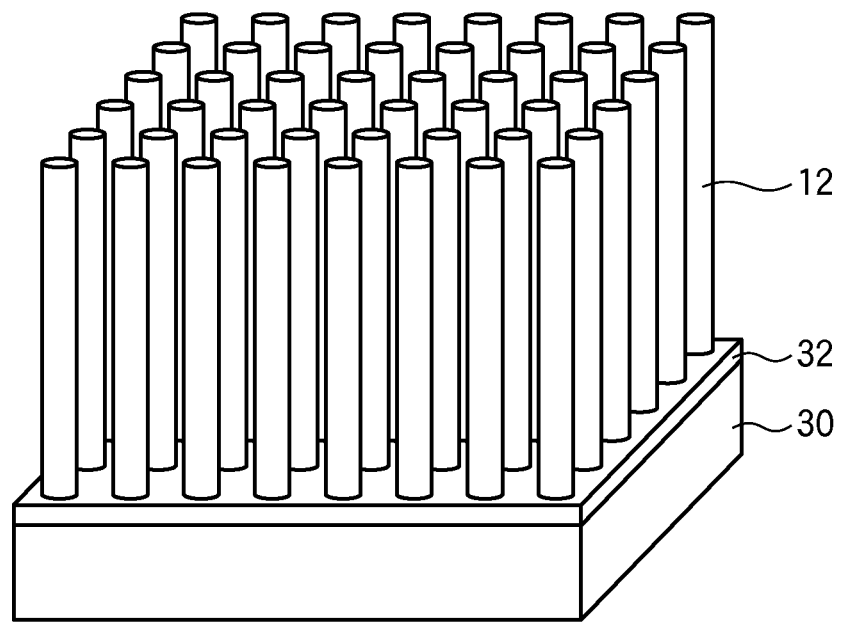

Thus, over the substrate 30, a plurality of carbon nanotubes 12 oriented in the normal direction of the substrate 30 (vertically oriented) are formed (FIG. 4B). The area density of the carbon nanotubes 12 formed under the above-described growth conditions was about $1 \times 10^{11}$ tubes/cm$^2$.

Figure 5A:
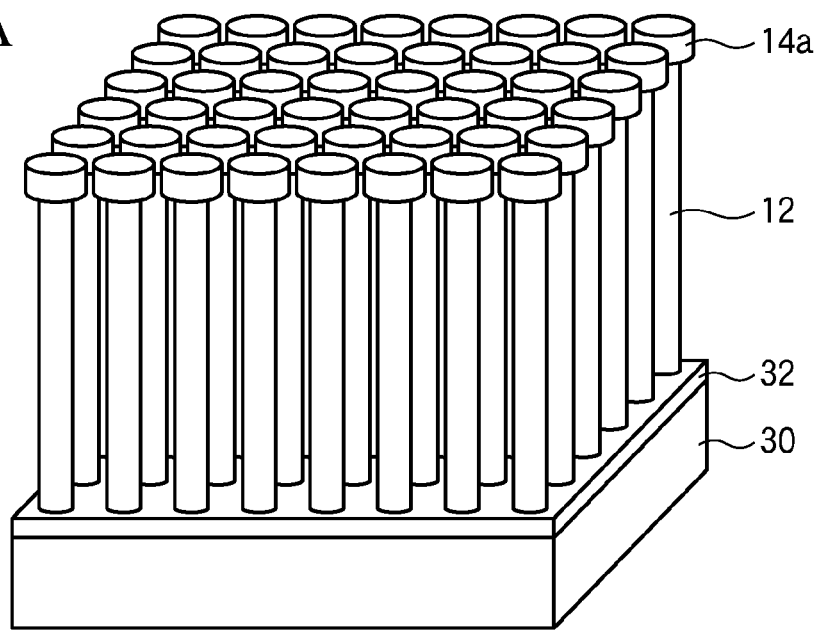

Next, over the carbon nanotubes 12, a 10 nm-thickness titanium (Ti) film, for examples, and a 300 nm-thickness gold (Au) film, for example, are deposited by, e.g., sputtering method. Thus, over the carbon nanotubes 12, a coating film 14a of the layer structure of Au/Ti is formed (FIG. 5A). At this time, the coating length Lc at the ends of the carbon nanotubes 12 becomes about 3 times the deposited film thickness.

The constituent material of the coating film 14a is not especially limited as long as the material has a higher thermal conductivity than the constituent material of the filling layer 16. When the carbon nanotube sheet 10 is used in electric conductive applications, materials of electric conductivity, e.g., metals, alloys, etc. can be used. As the materials of the coating film 14a, copper (Cu), nickel (Ni), gold (Au), indium (In) low melting point solder, etc., for example, can be used. The coating film 14a may have the single structure of these metals or the layer structure of two layers or three or more layers, such as the layer structure of titanium and gold described above, etc.

In the above-described example, the layer structure of Au/Ti is used, because titanium is good in adhesion to the carbon nanotubes 12. Titanium film is formed between gold film and the carbon nanotubes 12, whereby the thermal contact resistance and the contact resistance between the carbon nanotubes 12 and the coating film 14a can be decreased. In terms of improving the adhesion, preferably, the titanium film is formed in a thickness of not less than about 10 nm.

Then, a substrate (or a sheet) 40 which is different from the substrate 30 is prepared as the substrate for the carbon nanotubes 12 formed on the substrate 30 to be transferred onto. As the substrate 40, a semiconductor substrate, such as a silicon substrate, etc., an alumina (sapphire) substrate, an MgO substrate, a glass substrate, etc. can be used. Thin film may be formed on these substrates. For example, a silicon substrate with an about 300 nm-thickness silicon oxide film formed on may be used.

Then, an adhesive layer 42 is formed on the substrate 40. As the constituent material of the adhesion layer 42, a material which is capable of selectively etching the constituent material of the filling layer 16 to be formed later is used. For example, when the filling layer 16 is formed of a silicone-based resin of no water solubility, the adhesion layer 42 can be formed of water-soluble polyvinyl alcohol (PVA).

Figure 5B:
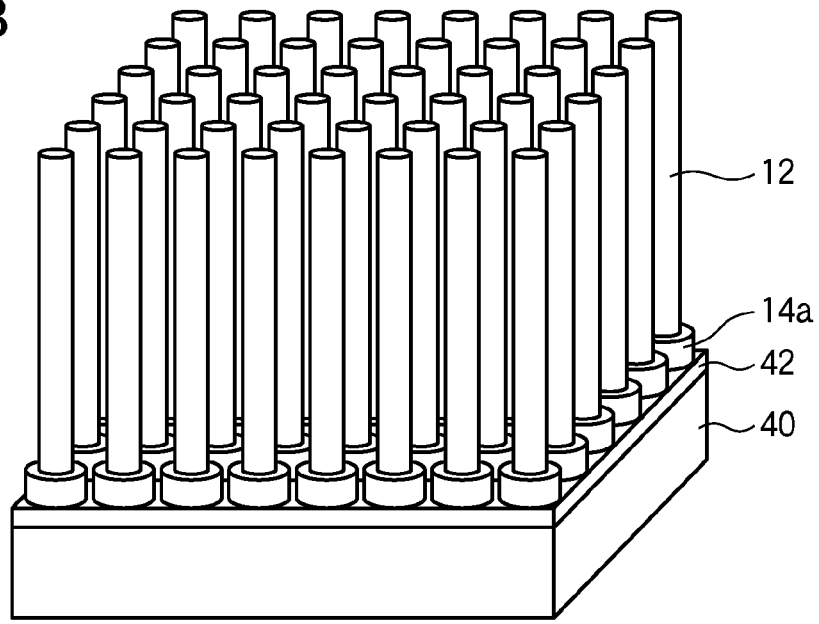

Next, onto the substrate 40 with the adhesive layer 42 formed on, the carbon nanotubes 12 formed on the substrate 30 are transferred (FIG. 5B). First, the substrate 30 and the substrate 40 are bonded to each other with the surface with the coating film 14a formed on and the surface with the adhesive layer 42 formed on opposed to each other. Then, the substrate 30 is peeled from the interface between the substrate 30 and the carbon nanotubes 12. The adhesion force of the coating film 14a with respect to the adhesive layer 42 is larger than that of the carbon nanotubes 12 with respect to the substrate 30, which allows the substrate 30 to be easily peeled form the interface with the carbon nanotubes 12. Thus, the carbon nanotubes 12 can be transferred onto the substrate 40.

Figure 6A:
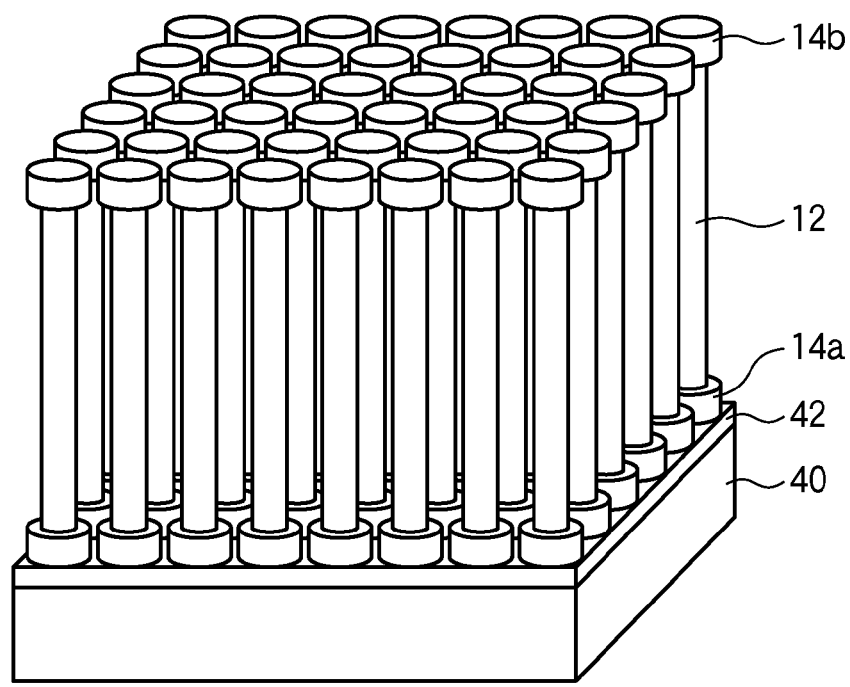

Then, over the carbon nanotubes 12 transferred onto the substrate 40, a 10 nm-thickness titanium (Ti) film, for example, and a 50 nm-thickness gold (Au) film, for example, are deposited by, e.g., sputtering method. Thus, the coating film 14b of the layer structure of Au/Ti is formed over the carbon nanotubes 12 (FIG. 6A). At this time, the coating length Lc at the ends of the carbon nanotubes 12 becomes about three times the deposited film thickness.

The constituent material of the coating film 14b is not especially limited as long as the material has a higher thermal conductivity than the constituent material of the filling layer 16. When the carbon nanotube sheet 10 is used in electric conductive applications, materials of electric conductivity, e.g., metals, alloys, etc. can be used. As the materials of the coating film 14b, copper (Cu), nickel (Ni), gold (Au), indium (In) low melting point solder, etc., for example, can be used. The coating film 14b may have the single structure of these metals or the layer structure of two layers or three or more layers, such as the layer structure of titanium and gold described above, etc.

Then, by, e.g., dipping method, a filling material to be the filling layer 16 is filled between the carbon nanotubes 12. For example, the substrate 40 with the carbon nanotubes 12 transferred to is pressed for, e.g., 1 minute against a substrate with silicone-based resin of an 800 mPa·s viscosity spin-coated under the conditions of, e.g., 1000 rpm and 20 seconds. Thus, by the capillary phenomena, the silicone-based resin as the filling material is filled between the carbon nanotubes 12 up to substantially the same height as the carbon nanotubes 12.

The filling material is not especially limited as long as the filling material is liquefied and then can be solidified. For example, as organic fillers, acryl resin, epoxy resin, silicone resin, polyimide resin, etc. can be used. As the inorganic filling materials, insulating film forming compositions by using spin coating, such as SOG (Spin On Glass), etc., can be used. Metal materials, such as indium, solder, metal pastes (e.g., silver paste), etc. can be used. Electric conductive polymers, such as polyaniline, polythiophene, etc., can be used.

With carbon nanotubes 12 formed on the entire surface of the substrate 40, when the filling material penetrates between the carbon nanotubes 12, the respective carbon nanotubes 12 often cohere, lose the original orientation and have configurational changes, such as transverse falls, etc. In the present embodiment, however, the configurational changes of the carbon nanotubes 12 are suppressed, and the cohesion can be prevented, because the coating films 14a, 14b are provided on the both ends of the carbon nanotubes 12.

Figure 6B:
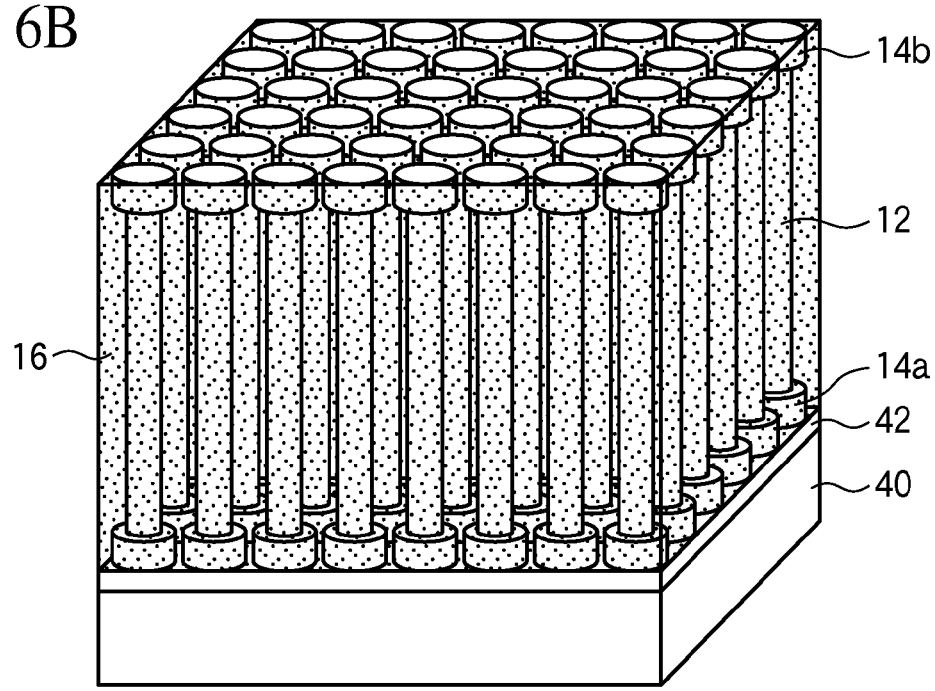

Then, the filling material filled between the carbon nanotubes 12 is solidified to form the filling layer 16 (FIG. 6B). For example, when a photosetting material, such as acryl resin or others, is used, the filling material can be solidified by light irradiation. When a thermosetting material, such as epoxy resin, silicone-based resin, etc., is used as the filling material, the filling material can be solidified by thermal processing. Epoxy resin can be thermally set by, e.g., 1 hour of thermal processing of 150° C. Silicone-based resin can be thermally set by, e.g., 1 hour of thermal processing of 200° C.

After the filling layer 16 has been solidified, when the coating film 14b on the carbon nanotubes 12 is not sufficiently exposed or is covered by the filling layer 16, the filling layer 16 on the coating film 14b may be removed by, e.g., chemical mechanical polish or oxygen plasma ashing. This is effective to remove residues of the adhesive layer 42 on the coating film 14b when they are.

Figure 7:
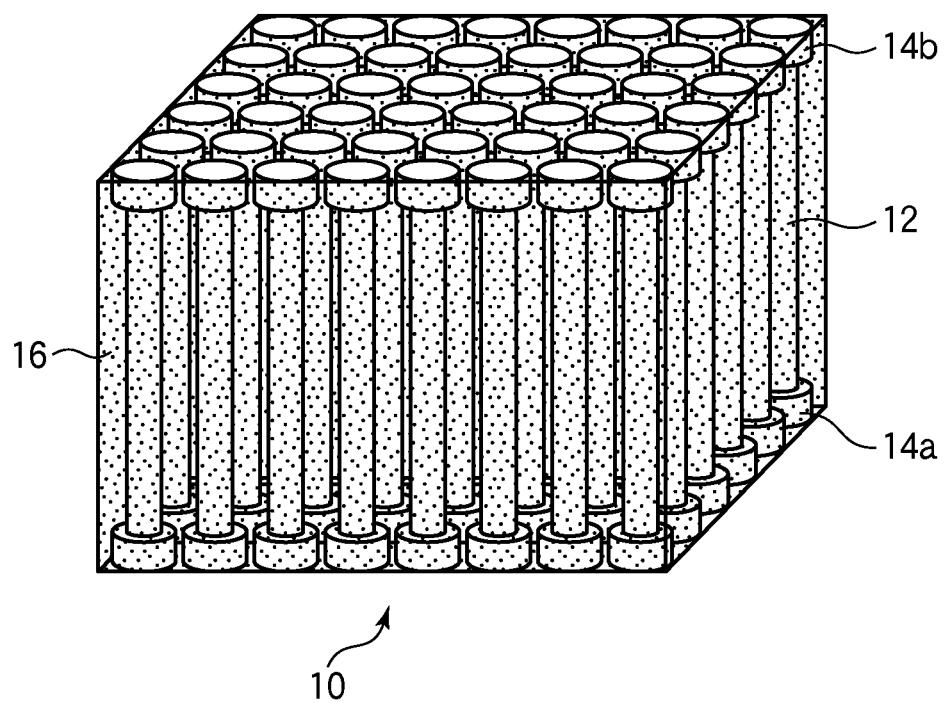

Next, the carbon nanotubes 12 and the filling layer 16 having both ends covered by the coating film 14 are peeled from the substrate 40 to obtain the carbon nanotubes sheet 10 (FIG. 7).

For example, the adhesive layer 42 is etched selectively with respect to the filling layer 16, whereby the carbon nanotube sheet 10 can be easily peeled. For example, when the filling layer 16 is formed of silicone-based resin, and the adhesive layer 42 is formed of vinyl alcohol, the adhesive layer 42 is solved by immersion in water or warm water to thereby peel the carbon nanotube sheet 10.

As described above, according to the present embodiment, the coating film of high thermal conductivity is formed on the ends of the carbon nanotubes, whereby the thermal contact resistance and the contact resistance between the carbon nanotubes and a sheet mounted body can be drastically decreased. Thus, the thermal conductivity and the electric conductivity of the carbon nanotube sheet can be improved.

A Second Embodiment

The method of manufacturing the carbon nanotube sheet according to a second embodiment will be explained with reference to FIGS. 8A and 9B. The same members of the carbon nanotube sheet and the method of manufacturing the carbon nanotube sheet according to the first embodiment illustrated in FIGS. 1 to 7 are represented by the same reference numbers not to repeat or to simplify their explanation.

FIGS. 8A to 9B are perspective views illustrating the method of manufacturing the carbon nanotube sheet according to the present embodiment.

The method of manufacturing the carbon nanotube sheet according to the present embodiment is the same as the method of manufacturing the carbon nanotube sheet according to the first embodiment except the process for transferring the carbon nanotubes 12 onto the substrate 40. The constituent materials of the respective parts and the details of the manufacturing method are the same as those of the first embodiment.

First, in the same way as in the method of manufacturing the carbon nanotube sheet according to the first embodiment illustrated in FIGS. 4A to 5A, the carbon nanotubes 12 and the coating film 14a formed on the ends of the carbon nanotubes 12 are formed on the substrate 30.

Then, as a substrate for transferring the carbon nanotubes 12 formed on the substrate 30, another substrate (or a sheet) 40 is prepared.

Next, over the substrate 40, a sacrificial layer 44, and a layer 46 of a material which can be thermo-pressed against the coating film 14a (hereinafter called "a thermo-pressed layer 46") are formed. The constituent material of the thermo-pressed layer 46, gold can be used when the surface of the coating film 14a is formed of gold. As the constituent material of the sacrificial layer 44, a material which is capable of being selectively etched with respect to the thermo-pressed layer 46 is used. When the thermo-pressed layer 46 is, e.g., gold, titanium, for example, can be used.

Figure 8A:
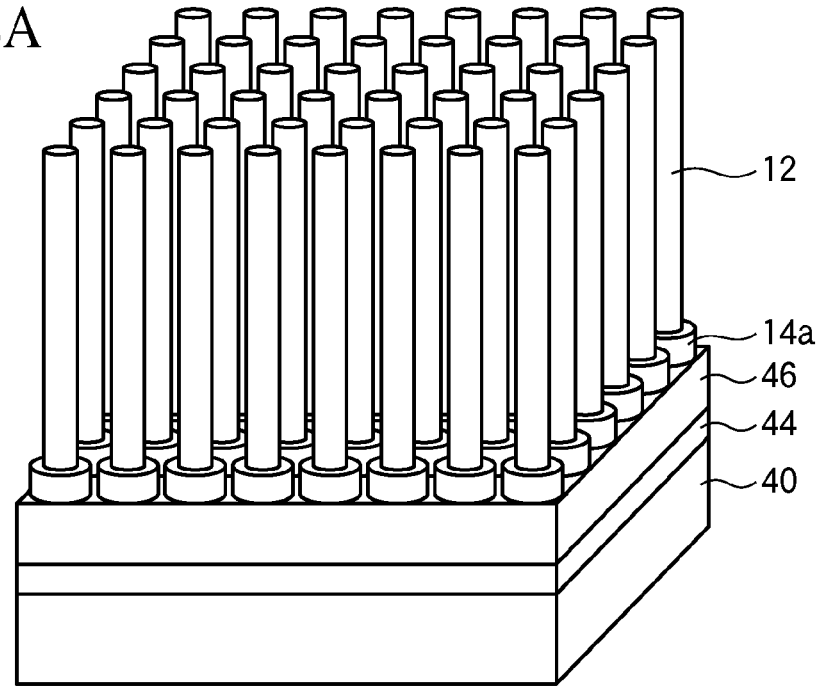
FIGS. 8A-8B and 9A-9B are perspective views illustrating a method of manufacturing the carbon nanotube sheet according to a second embodiment.

Then, onto the substrate 40 with the sacrificial layer 44 and the thermo-pressed layer 46 formed on, the carbon nanotubes 12 formed on the substrate 30 are transferred (FIG. 8A). First, the substrate 30 and the substrate 40 are superimposed over each other with the surface with the coating film 14a formed on and the surface with the thermo-pressed layer 46 formed on opposed to each other. Then, a pressure is applied between the substrate 30 and the substrate 40 while being heated to thereby thermo-press the coating film 14a and the thermo-pressed layer 46. Then, the substrate 30 is peeled from the interface between the substrate 30 and the carbon nanotubes 12. Because of the adhesion force of the coating film 14a to the thermo-pressed layer 46 which is larger than the adhesion force of the carbon nanotubes 12 to the substrate 30, the substrate 30 can be easily peeled from the interface with the carbon nanotubes 12. Thus, the carbon nanotubes 12 can be transferred onto the substrate 40.

Figure 8B:
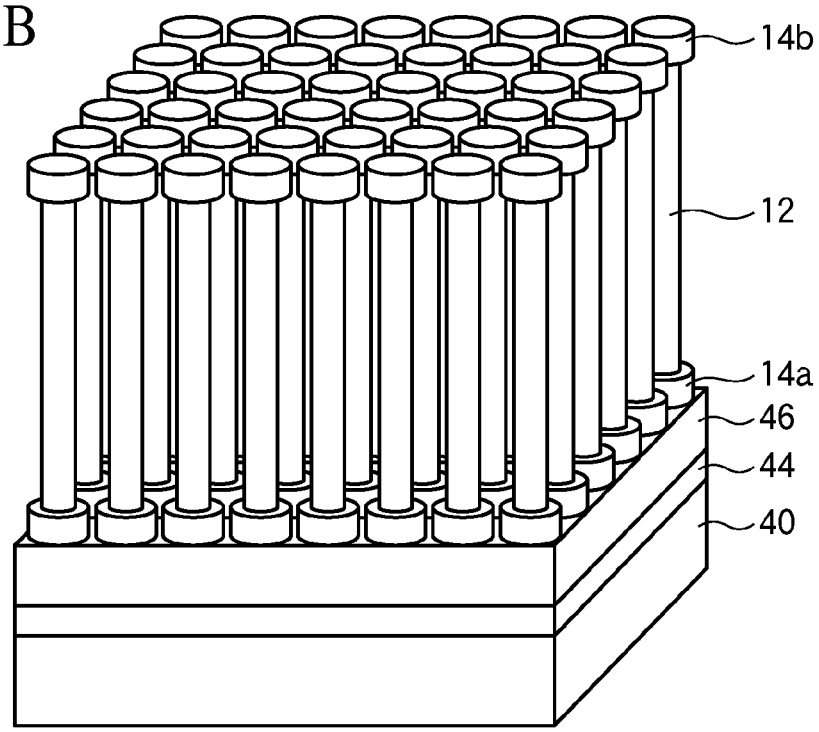

Then, in the same way as in the first embodiment, a 10 nm-thickness titanium (Ti) film, for example, and a 50 nm-thickness gold (Au) film, for example, are deposited by, e.g., sputtering method over the carbon nanotubes 12 transferred onto the substrate 40. Thus, a coating film 14b of the layer structure of Au/Ti is formed over the carbon nanotubes 12 (FIG. 8B).

Figure 9A:
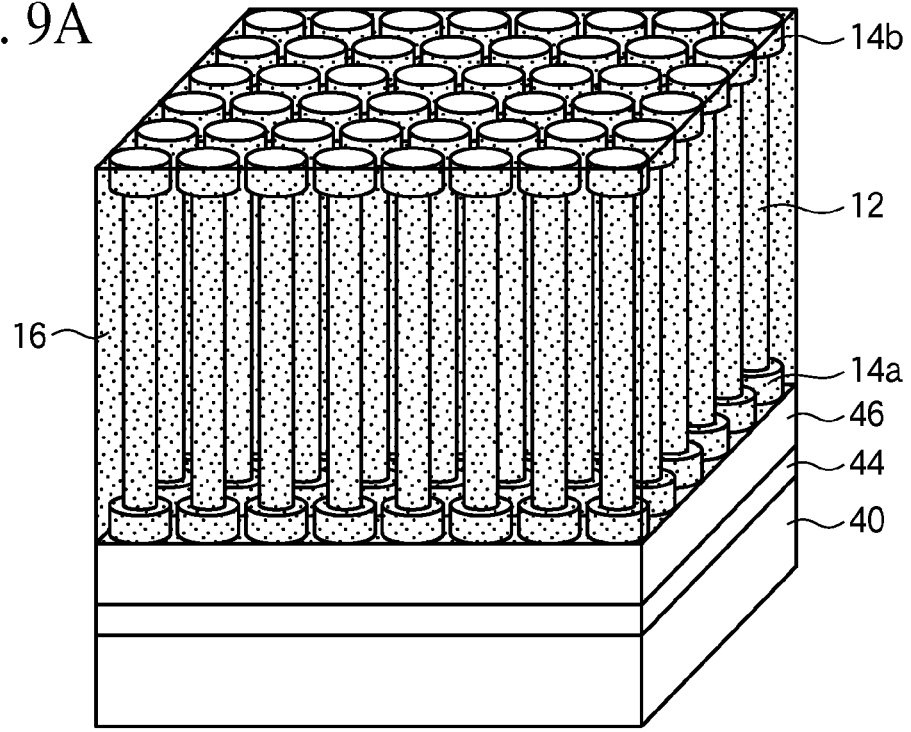

Then, in the same way as in the first embodiment, the filling layer 16 for filling the gaps between the carbon nanotubes 12 is formed (FIG. 9A).

Figure 9B:
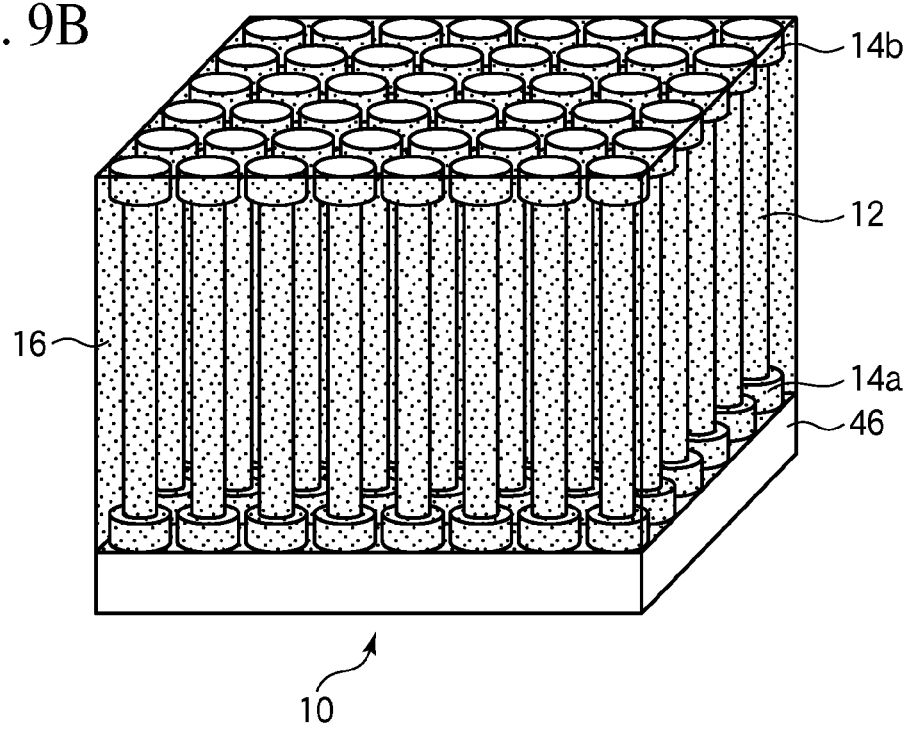

Then, the carbon nanotubes 12 having both ends covered by the coating films 14, and the filling layer 16 are peeled from the substrate 40, and the carbon nanotube sheet 10 is obtained (FIG. 9B).

The carbon nanotube sheet 10 can be easily peeled by etching the sacrificial layer 44 selectively to the thermo-pressed layer 46. For example, when the thermo-pressed layer 46 is formed of gold, and the sacrificial layer 44 is formed of titanium, the sacrificial layer 44 is dissolved by immersion into hydrofluoric acid aqueous solution to thereby peel the carbon nanotube sheet 10.

A Third Embodiment

The carbon nanotube sheet and method of manufacturing the same according to a third embodiment will be explained with reference to FIGS. 10 to 11B. The same members of the present embodiment as those of the carbon nanotube sheet and method of manufacturing the same according to the first and the second embodiments illustrated in FIGS. 1 to 9B are represented by the same reference numbers not to repeat or to simplify their explanation.

Figure 10:
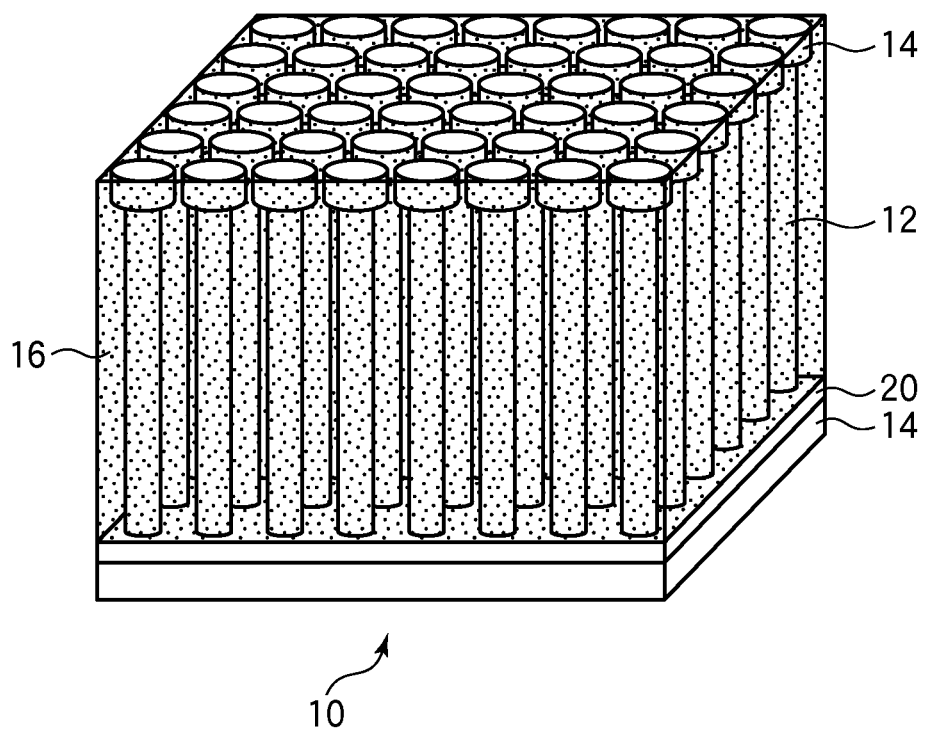
FIG. 10 is a perspective view illustrating a structure of the carbon nanotube sheet according to a third embodiment.
Figure 11A:
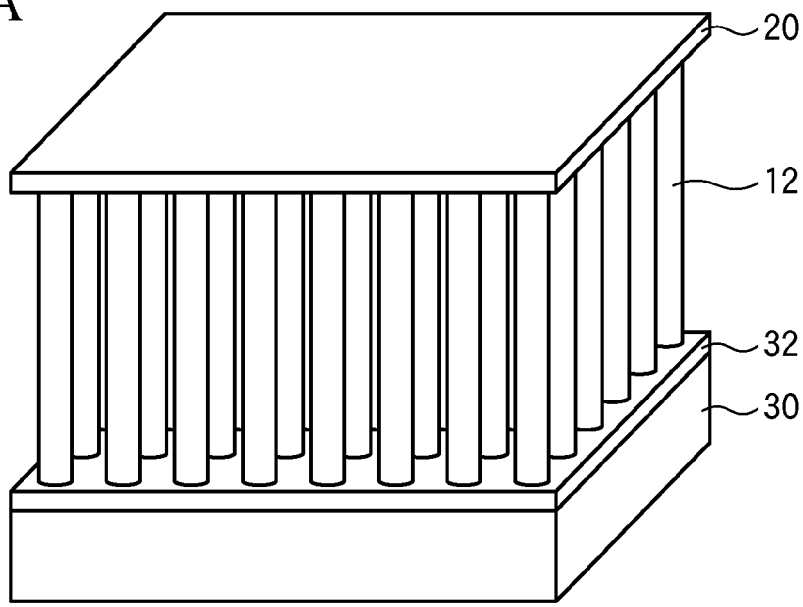
FIGS. 11A-11B are perspective views illustrating a method of manufacturing the carbon nanotube sheet according to the third embodiment.
Figure 11B:
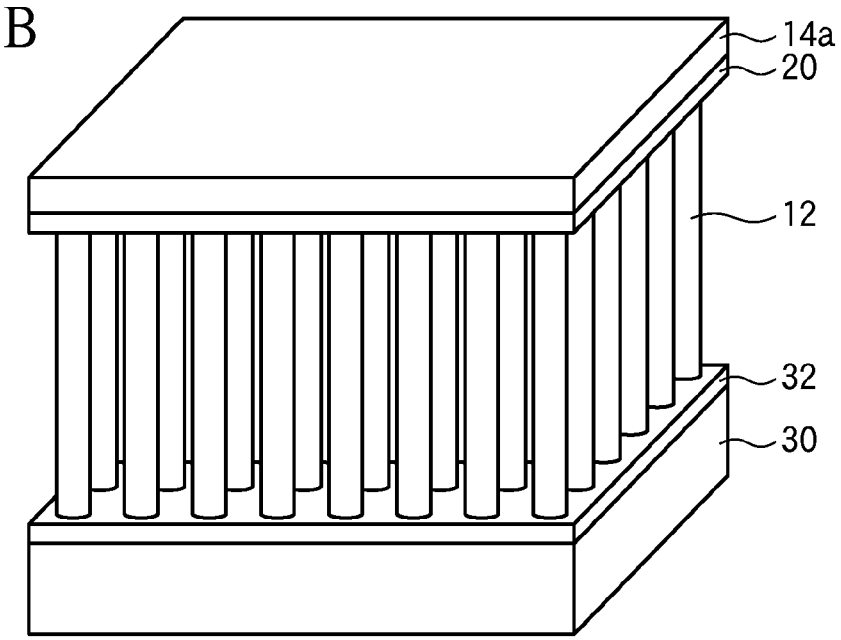

FIG. 10 is a perspective view illustrating a structure of the carbon nanotube sheet according to the present embodiment. FIGS. 11A-11B are perspective views illustrating a method of manufacturing the carbon nanotube sheet according to the present embodiment.

First, the structure of the carbon nanotube sheet according to the present embodiment will be explained with reference to FIG. 10.

As illustrated in FIG. 10, the carbon nanotube sheet 10 according to the present embodiment includes a graphite layer 20 between the carbon nanotubes 12 and a coating film 14. The graphite layer 20 is formed of graphite of a layer structure which is in parallel with the surface of the sheet and is formed, directly connected to one ends of the carbon nanotubes 12. The thickness of the graphite layer 14 is about some nms-hundreds nms.

The thermal conductivity of graphite is not less than above 500 times that of resin materials (thermal conductivity: about 1 W/m·K). Accordingly, the provision of the graphite layer 20 can drastically improve the heat radiation in the direction parallel with the sheet surface by not less than 500 times in comparison with that without the graphite layer 20.

It is preferable that when the carbon nanotube sheet 10 according to the present embodiment is formed between a heat generator and a heat radiator, the ends of the carbon nanotubes 12 on the side of the graphite layer 20 are positioned on the side of the heat generator. The carbon nanotube sheet 10 is so positioned, whereby the heat from the heat generator can be quickly conducted by the graphite layer 20 in the direction parallel to the sheet surface. Thus, the heat radiation efficiency of the heat radiation toward the heat radiator via the carbon nanotubes 12 can be improved.

Next, the method of manufacturing the carbon nanotube sheet according to the present embodiment will be explained with reference to FIGS. 11A-11B. The constituent materials of the respective constituent parts and the details of the manufacturing method are the same as those of the first embodiment.

First, the substrate 30 is prepared as the base for forming the carbon nanotube sheet 10. As the substrate 30, various substrate described in the first embodiment can be used.

Next, over the substrate 30, a 5 nm-thickness TiN film, for example, and a 2.6 nm-thickness Co film, for example, are sequentially deposited to form the catalyst metal film 32 of the layer structure of Co/Ti. As the base film of the catalyst metal film 38, other than TiN, materials containing Ti, e.g., Ti (titanium), $TiO_2$ (titanium oxide), etc. can be used.

Next, over the substrate 30 with the catalyst metal film 32 as the catalyst, the carbon nanotubes 12 having the upper surfaces covered by the graphite layer 20 are grown by, e.g., thermal CVD method (FIG. 11A).

The carbon nanotubes 12 having the upper surfaces covered by the graphite layer 20 can be formed by being grown at a relatively low temperature of about 450-510° C. and with a hydrocarbon, e.g., acetylene, methane, ethylene, etc.-based raw material gas. For example, as the raw material gas, a mixed gas of acetylene and argon (partial pressure ratio: 1:9) is used, the total gas pressure in the film forming chamber is 1 kPa, the temperature is 450-510° C., and the growth period of time is 30 minutes. Thus, multi-walled carbon nanotubes of a wall number of 3-6 walls (about 4 walls at average), a 4-8 nm diameter (6 nm at average) and a 20 nm-length can be grown. On the carbon nanotubes 12, the graphite layer 20 of an 18 nm-thickness is also formed.

The carbon nanotubes 12 having the upper surfaces covered by the graphite layer 20 can be formed by suitably controlling the film thickness of the catalyst metal film 38 (the film thickness of Co film) and the film forming temperature. The inventors of the present application made studies and have found that the carbon nanotubes 12 having the upper surfaces covered by the graphite layer 20 can be formed by being grown with the film thickness of the Co film set at 2.0-7.0 nm and at the film forming temperature of 350-560° C.

The thickness of the graphite layer 20 to be formed can be also controlled by the film thickness of the Co film and the film forming temperature. For example, with the film forming temperature set at 510° C. and the film thickness of the Co film set at 2.1 nm, the graphite layer could be formed in a 4 nm-thickness. With the film thickness of the Co film set at 2.6 nm, the graphite layer could be formed in an 18 nm-thickness. With the film thickness of the Co film set at 3.6 nm, the graphite layer could be formed in a 30 nm-thickness. With the film forming temperature set at 450° C. and the film thickness of the Co film set at 3.6 nm, the graphite layer could be formed in a 20 nm-thickness.

The mechanism of the carbon nanotubes 12 having the upper surfaces covered by the graphite layer 20 being formed is not clear, but the inventors of the present application consider as follows.

In the present embodiment, the growth of the carbon nanotubes 12 is made at the relatively low temperature. It is considered that in the initial growth process, the Co film of the catalyst metal film 32 has not sufficiently cohered, which permits the graphite to grow homogeneously on the catalyst metal film 32, then, together with the cohesion of the Co film, the carbon nanotubes start to grow, and consequently, the carbon nanotubes 12 having the upper surfaces covered by the graphite layer 20 are formed.

When the carbon nanotubes 12 having the upper surfaces covered by the graphite layer 20 are formed, the graphite layer 20 is formed within about 1 second of the initial growth process. The length of the carbon nanotubes 12 can be arbitrarily controlled by the growth period of time.

Then, in the same way as in the first embodiment, the 10 nm-thickness titanium (Ti) film, for example, and the 50 nm-thickness gold (Au) film, for example, are deposited by, e.g., sputtering method. Thus, the coating film 14a of the layer structure of Au/Ti is formed over the graphite layer 20 (FIG. 11B).

Next, in the same way as in the first or the second embodiment, the carbon nanotubes 12 are transferred onto the substrate 40, and then the coating film 14b is formed on the other ends of the carbon nanotubes 12.

Then, in the same way as in the first embodiment, the filling layer 16 is formed between the carbon nanotubes 12, and then, the substrate 40 is peeled, and the carbon nanotube sheet 10 according to the present embodiment is completed.

As described above, according to the present embodiment, the coating film of the material of the high thermal conductivity is formed on the ends of the carbon nanotubes, whereby the thermal contact resistance and the contact resistance between the carbon nanotubes and a sheet mounted body can be drastically decreased. Because of the graphite layer directly connected to one ends of the carbon nanotubes, the thermal conductivity and electric conductivity in the direction parallel to the sheet surface can be improved. Thus, the thermal conductivity and the electric conductivity of the carbon nanotube sheet can be improved.

A Fourth Embodiment

The carbon nanotube sheet and the method of manufacturing the same according to a fourth embodiment will be explained with reference to FIGS. 12A and 12B. The same members of the present embodiment as those of the carbon nanotube sheet and the method of manufacturing the same according to the first to the third embodiments illustrated in FIGS. 1 to 11B are represented by the same reference numbers not to repeat or to simplify their explanation.

Figure 12A:
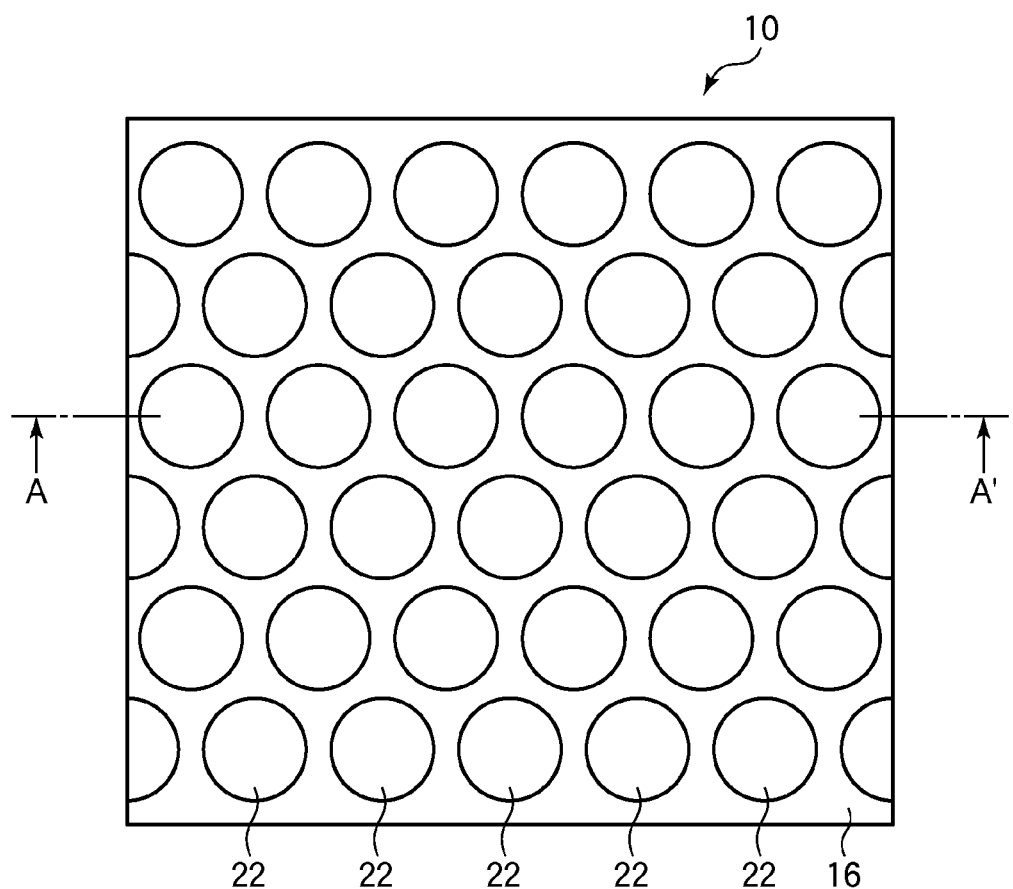
FIG. 12A is a plan view illustrating a structure of the carbon nanotube sheet according to a fourth embodiment.
Figure 12B:
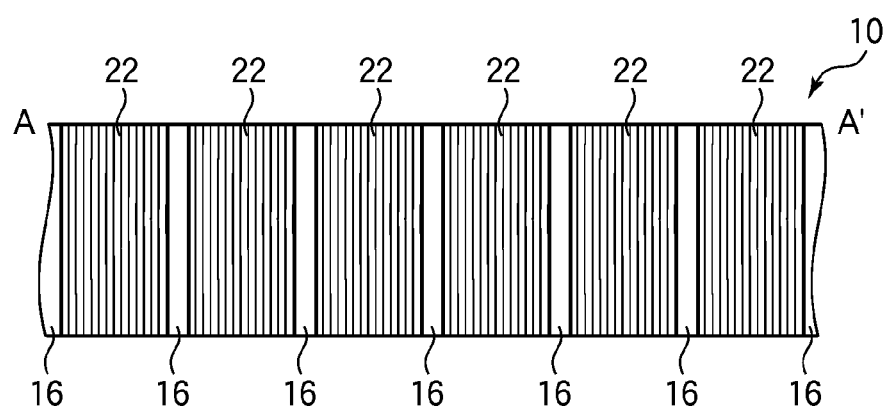
FIG. 12B is a diagrammatic sectional view illustrating the structure of the carbon nanotube sheet according to the fourth embodiment.

FIG. 12A is a plan view illustrating a structure of the carbon nanotube sheet according to the present embodiment. FIG. 12B is a diagrammatic sectional view illustrating the structure of the carbon nanotube sheet according to the present embodiment. FIG. 12B is the sectional view along the line A-A' in FIG. 12A.

In the first to the third embodiments, the carbon nanotubes 12 are formed uniformly on the entire surface of the carbon nanotube sheet. However, the carbon nanotubes 12 may not be formed essentially on the entire surface and, as illustrated in FIG. 12, carbon nanotube bundles 22 each containing a plurality of carbon nanotubes 12 having both ends covered by the coating film (not illustrated) may be arranged. Thus, when the filling layer 16 is buried between the carbon nanotubes 12, the penetration of the filling material can be improved, whereby configuration changes of the carbon nanotubes 12, such as their horizontal falls, etc., can be effectively suppressed, and the initial orientation of the carbon nanotubes 12 can be easily retained.

The gap required between the carbon nanotube bundles 22 cannot be unconditionally determined because the gap varies depending on viscosities, etc. of filling materials to be the filling layer 16. Preferably, the gap may be sufficiently wider than a gap between the carbon nanotubes 12 forming each carbon nanotube bundle 22 and can be set at about 0.1-200 µm. However, as the gap between the carbon nanotube bundles 22 becomes larger, the area density of the carbon nanotube in the sheet plane decreases, that is, the thermal conductivity of the sheet decreases. The area density of the carbon nanotubes in the sheet plane varies also depending on sizes of the carbon nanotube bundles 22. Accordingly, it is preferable to suitably set the gap between the carbon nanotube bundles 22 corresponding to the thermal conductivity required of the sheet and also in consideration of a size of the carbon nanotube bundles 22.

The plane shape of each carbon nanotube bundles 22 is not limited to the circle illustrated in FIG. 12A. The plane shape of the carbon nanotube bundles 22 can be, other than the circle, a polygon, such as triangle, rectangle, hexagon or others. The arrangement of a plurality of the carbon nanotube bundles 22 is not limited to the close-packed arrangement of circles illustrated in FIG. 12A.

The method of manufacturing the carbon nanotube sheet according to the present embodiment is the same as the first to the third embodiments except that in the present embodiment, the carbon nanotubes 12 are grown selectively on prescribed regions (regions for the carbon nanotube bundles 22 to be formed in) on the substrate 30.

To selectively grow the carbon nanotubes 12, the catalyst metal film 32 may be formed selectively in the regions for the carbon nanotube bundles 22 to be formed in. To selectively form the catalyst metal film 32, for example, the lift-off using a photoresist film, sputtering the catalyst metal with the surface of the substrate 30 covered with a metal mask, etc. can be used.

In the case that the carbon nanotube bundles 22 formed as illustrated in FIG. 12A, in the process of forming the filling layer 16, the filling material spreads first along the gaps between the carbon nanotube bundles 22 and over the entire surface of the substrate 40. Then, the filling material penetrates into the carbon nanotube bundles 22. The filling material which has been first filled between the carbon nanotube bundles 22 plays the role of the supporter for retaining the configuration of the carbon nanotubes 12 when the filling material penetrates into the carbon nanotube bundles 22 and suppresses configuration changes of the carbon nanotube bundles 22. Thus, in cooperation with the above-described effect of coating film 14, the cohesion of the carbon nanotubes 12 can be further effectively prevented.

As described above, according to the present embodiment, the coating film of a material of high thermal conductivity is formed on the ends of the carbon nanotubes, whereby the thermal contact resistance and the contact resistance between the carbon nanotubes and a sheet mounted body can be drastically decreased. A plurality of carbon nanotube bundles are formed, spaced from each other, whereby configuration changes of the carbon nanotube bundles can be prevented when the filing layer is formed. Thus, the thermal conductivity and the electric conductivity of the carbon nanotube sheet can be improved.

A Fifth Embodiment

The carbon nanotube sheet and the method of manufacturing the same according to a fifth embodiment will be explained with reference to FIGS. 13 to 15B. The same members of the present embodiment as those of the carbon nanotube sheet and the method of manufacturing the same according to the first to the fourth embodiments illustrated in FIGS. 1 to 12B are represented by the same reference numbers not to repeat or to simplify their explanation.

Figure 13:
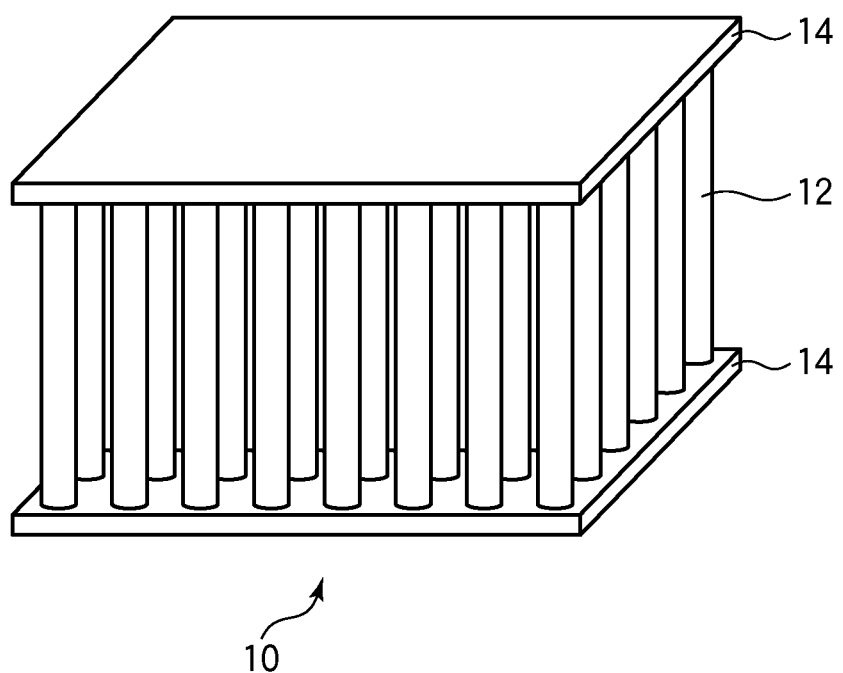
FIG. 13 is a perspective view illustrating a structure of the carbon nanotube sheet according to a fifth embodiment.

FIG. 13 is a perspective view illustrating a structure of the carbon nanotube sheet according to the present embodiment. FIGS. 14A-14B and 15A-15B are perspective views illustrating a method of manufacturing the carbon nanotube sheet according to the present embodiment.

First, the structure of the carbon nanotube sheet according to the present embodiment will be explained with reference to FIG. 13.

The carbon nanotube sheet 10 according to the present embodiment includes a plurality of carbon nanotubes 12 having both ends coated by coating films 14 of a material of thermal conductivity and/or electric conductivity. The coating film 14 formed on the ends of the neighboring carbon nanotubes 12 is continuous. That is, the coating film 14 is formed continuously over the entire surfaces of both surface of the carbon nanotube sheet 10.

The carbon nanotubes 12 are oriented vertically to the surface of the sheet. The carbon nanotubes 12 can be either of single-walled carbon nanotubes and multi-walled carbon nanotubes. The density of the carbon nanotubes 12 is preferably not less than $1 \times 10^{10}$ tubes/cm$^2$ in terms of the heat radiation and electric conduction. The length of the carbon nanotubes 12 is determined by applications of the carbon nanotube sheet 10 and is not especially limited. However, the length of the carbon nanotubes 12 can be set preferably at about 5-500 µm.

The material of the coating films 14 formed on both surfaces of the carbon nanotube sheet 10 is not especially limited as long as the material has a high thermal conductivity, e.g., not less than 1 (W/m·K). The material having a thermal conductivity of not less than 1 (W/m·K) is based on that the coating films 14 is formed of a material of a sufficiently higher thermal conductivity than the thermal conductivity of the general resin materials (about 0.1 (W/m·K)). When the carbon nanotube sheet 10 is used for electric conduction, the material having electric conductivity, e.g., metals, alloys, etc. can be used. As the constituent material of the coating film 14, for example, copper (Cu), nickel (Ni), gold (Au) and indium (In) low melting point solder, etc. can be used. The coating film 14 may not essentially have a single layer structure and may have the layer structure of two layers or three or more layers, such as the layer structure of titanium (Ti) and gold (Au) or others.

Because of the coating film 14 of high thermal conductivity provided on the ends of the carbon nanotubes 12, the contact area of the carbon nanotube sheet 10 to a mounted body (heat radiator or heat generator) can be increased. Thus, the thermal contact resistance of the carbon nanotubes 12 to the mounted body is decreased, and the thermal conductivity of the carbon nanotube sheet 10 can be improved.

When the carbon nanotubes 12 are grown in an about $1 \times 10^{11}$ tubes/cm$^2$ density, the gap between the carbon nanotubes 12 is about 30-50 nm. In this case, when the coating films 14 to be deposited on the end surfaces of the carbon nanotubes 12 is set at above about 100 nm, the coating film 14 formed on the neighboring carbon nanotubes 12 joins each other, and the coating film 14 is formed on the surfaces of the carbon nanotube sheets 10 continuous.

The neighboring carbon nanotubes 12 are connected to each other by the coating films 14, whereby even if the length of the carbon nanotubes 12 becomes disuniform, and resultantly some of the carbon nanotubes 12 are not in contact with a mounted body, because of the transverse thermal conduction and electric conduction via the coating films 14, all the carbon nanotubes 12 can be used as a heat conductor, and the thermal conductivity can be improved.

The carbon nanotubes 12, which have electric conductivity, can be used as interconnections passed through the sheet by forming the coating films 14 of an electric conductive material. That is, the carbon nanotube sheet 10 according to the present embodiment can be used not only as a heat conduction sheet, but also as a vertical interconnecting sheet. When the carbon nanotube sheet 10 is used as a interconnecting sheet, the contact resistance between the carbon nanotubes 12 and a mounted body is decreased, the electric conductivity of the carbon nanotube sheet 10 can be increased.

After the carbon nanotube sheet has been brought into contact with a mounted body, the carbon nanotube sheet 10 can be reflowed by forming the coating films 14 of a material of low melting point, e.g., indium, low melting point solder or others. Thus, the concavities and convexities of the junction between the carbon nanotube sheet 10 and a mounted body can be filled with the coating films 14, whereby the thermal conductivity and the electric conductivity between them can be further improved.

The carbon nanotube sheet 10 according to the present embodiment does not include the filling layer 16, as does the carbon nanotube sheet according to the first to the fourth embodiments. This is because the coating films 14 are formed, covering all the surfaces, whereby the carbon nanotubes 12 can be supported by the coating films 14. The major role of the filling layer 16 is to support the carbon nanotubes 12, retaining their orientation. Accordingly, in the carbon nanotube sheet 10 according to the present embodiment, in which the carbon nanotubes 12 are supported by the coating films 14, the filling layer 16 is not essential. However, the filling layer 16 may be formed in the carbon nanotube sheet according to the present embodiment.

The film thickness of the coating films 14 can be suitably set depending on characteristics required of the carbon nanotube sheet 10. In terms of supporting the carbon nanotubes 12, the film thickness of the coating film 14 is preferably not less than some μms.

Next, the method of manufacturing the carbon nanotube sheet according to the present embodiment will be explained with reference to FIGS. 14A to 15B. The constituent materials of the respective constituent members and the details of the manufacturing method are the same as those of the first embodiment.

Figure 14A:
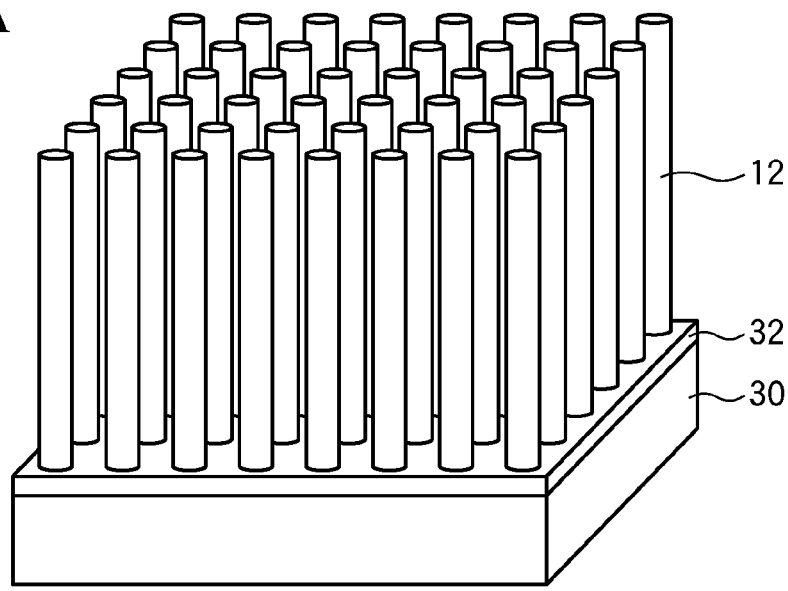
FIGS. 14A-14B and 15A-15B are perspective views illustrating a method of manufacturing the carbon nanotube sheet according to the fifth embodiment.

First, in the same way as in the method of manufacturing the carbon nanotube sheet according to the first embodiment illustrated in, e.g., FIGS. 4A and 4B, the carbon nanotubes 12 are formed over the substrate 30 (FIG. 14A). In the same way as in the third embodiment, the carbon nanotubes 12 having the graphite layer formed on the upper ends may be formed.

Figure 14B:
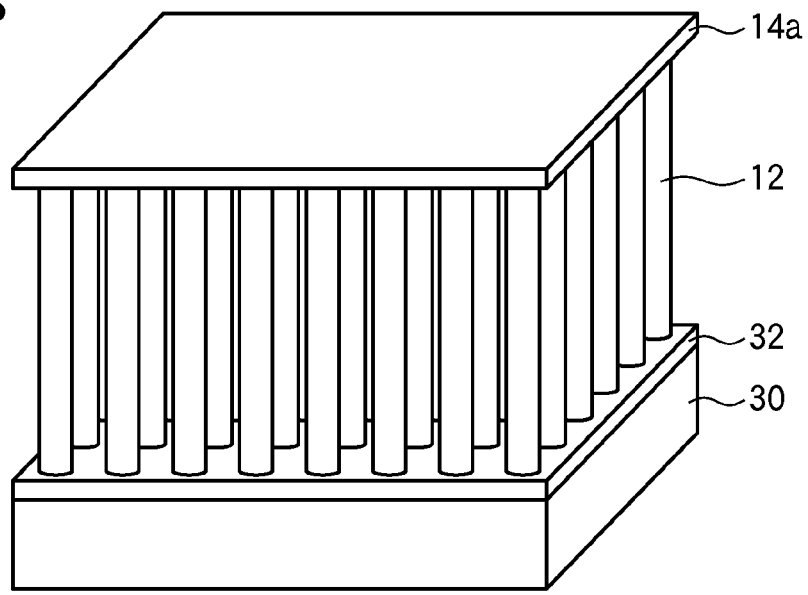

Next, over the carbon nanotubes 12, some μm-thickness indium (In) film, for example, is deposited by, e.g., evaporation method. Thus, In film is deposited on the carbon nanotubes 12, and the In film formed on neighboring carbon nanotubes 12 joins each other, and the coating film 14a of In which is continuous over the entire surface is formed (FIG. 14B).

The constituent material of the coating film 14a is not especially limited as long as the material has high thermal conductivity. When the carbon nanotube sheet 10 is used for electric conduction, materials having electric conductivity, e.g., metals, alloys, etc. can be used. As the constituent materials of the coating film 14, for example, copper (Cu), nickel (Ni), gold (Au), indium (In), low melting point solder, etc. can be used. The coating film 14a may have the single layer structure of these metals or the layer structure of two layers, or three or more layers, such as the layer structure of titanium and gold described above, etc.

Figure 15A:
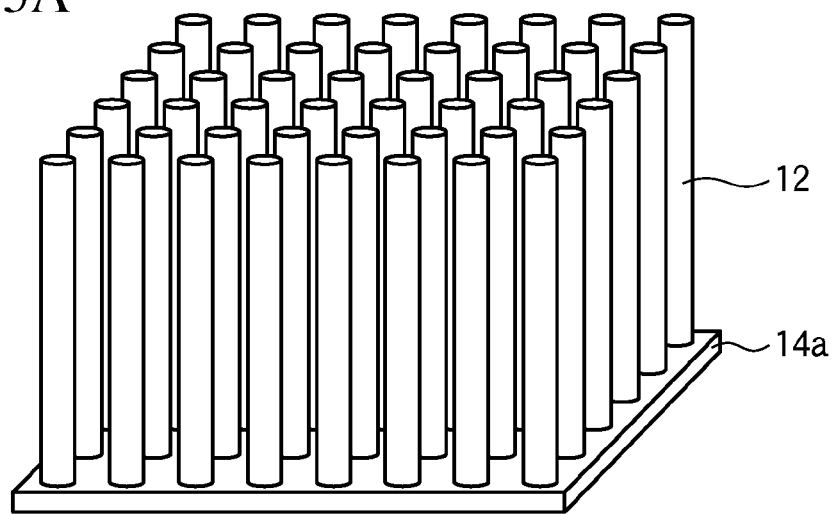

Then, the carbon nanotubes 12 and the coating film 14a are peeled from the substrate 30 (FIG. 15A).

Next, some μm-thickness indium (In) film, for example, is deposited by, e.g., evaporation method over the surfaces of the carbon nanotubes 12, from which the substrate 30 has been peeled. Thus, the In film is deposited on the carbon nanotubes 12, and the In film formed on the neighboring carbon nanotubes 12 joins each other, and the coating film 14b of In is formed continuous over the entire surface.

The constituent material of the coating film 14b is not especially limited as long as the material has high thermal conductivity. When the carbon nanotube sheet 10 is used for electric conduction, materials having electric conductivity, e.g., metals, alloys, etc. can be used. The constituent material of the coating film 14a can be, e.g., copper (Cu), nickel (Ni), gold (Au), indium (In), low melting point solder, etc. The coating film 14a may have the single layer structure of these metals or the layer structures of two layers, or three or more layers, such as the layer structure of titanium and gold described above, etc.

Figure 15B:
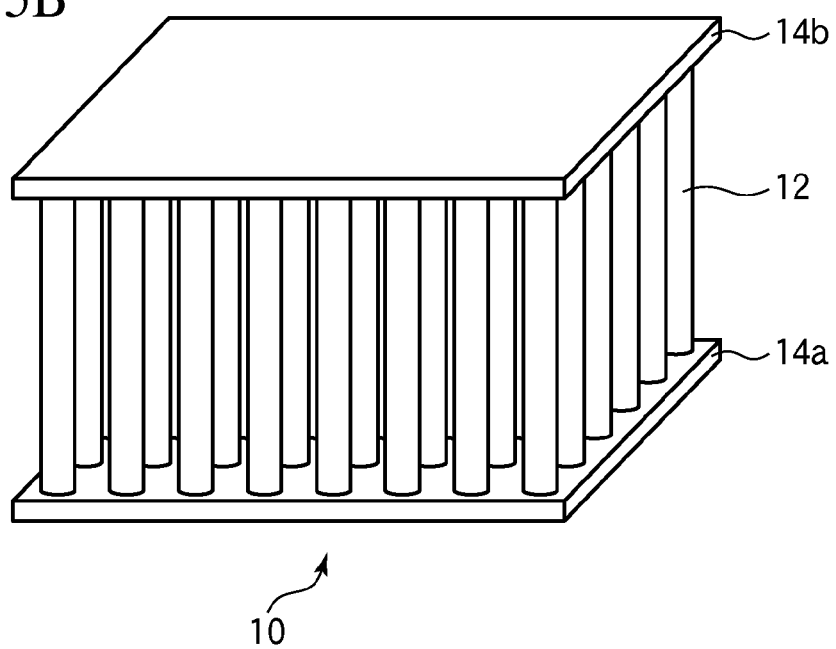

Thus, the carbon nanotube sheet 10 according to the present embodiment is completed (FIG. 15B).

As described above, according to the present embodiment, the coating films of high thermal conductivity is formed on the ends of the carbon nanotubes, whereby the thermal contact resistance and the contact resistance between the carbon nanotubes and a sheet mounted body can be drastically decreased. Thus, the thermal conductivity and the electric conductivity of the carbon nanotube sheet can be improved.

A Sixth Embodiment

The carbon nanotube sheet and the method of manufacturing the same according to a sixth embodiment will be explained with reference to FIGS. 16 to 19. The same members of the present embodiment as those of the carbon nanotube sheet and the method of manufacturing the same according to the first to the fifth embodiments illustrated in FIGS. 1 to 15B are represented by the same reference numbers not to repeat or to simplify their explanation.

Figure 16:
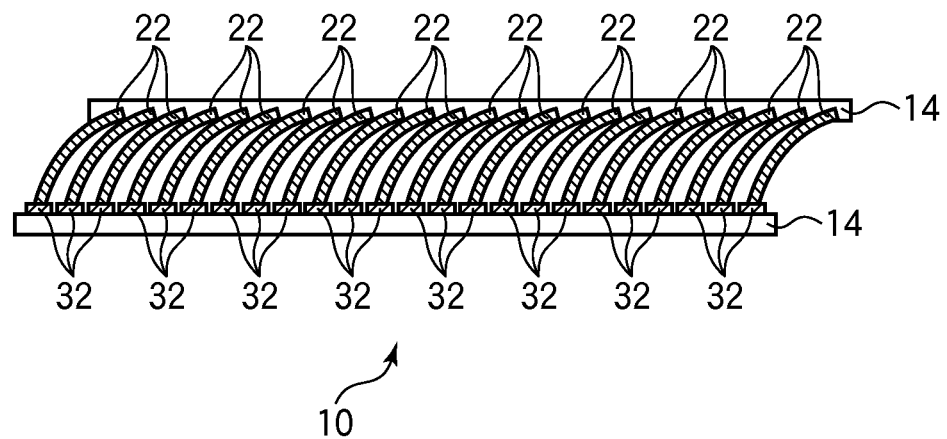
FIG. 16 is a diagrammatic sectional view illustrating a structure of the carbon nanotube sheet according to a sixth embodiment.

FIG. 16 is a diagrammatic sectional view illustrating a structure of the carbon nanotube sheet according to the present embodiment. FIGS. 17A-18C are diagrammatic sectional views illustrating a method of manufacturing the carbon nanotube sheet according to the present embodiment. FIG. 19 is a diagrammatic view illustrating a method for tilting the carbon nanotube bundles.

First, the structure of the carbon nanotube sheet according to the present embodiment will be explained with reference to FIG. 16.

As illustrated in FIG. 16, the carbon nanotube sheet 10 according to the present embodiment includes a plurality of carbon nanotube bundles 22, and a coating films 14 formed on both ends thereof. The coating films 14 formed on the ends of the neighboring carbon nanotube bundles 22 join each other. That is, the coating film 14 is formed continuous all over both surfaces of the carbon nanotube sheet 10.

The carbon nanotube bundles 22 are oriented from the side of one surfaces (lower surfaces in the drawing) toward the side of the other surfaces (the upper surfaces in the drawing) and tilted in the same direction intersecting the direction perpendicular to the sheet surface. The carbon nanotube bundles 22 neighboring each other in the tilting direction are in contact with each other near at least one ends (upper side in the drawing).

Each carbon nanotube bundle 22 includes a plurality of carbon nanotubes (not illustrated) oriented in the direction of orientation of the carbon nanotube bundle 22. The carbon nanotubes contained in each carbon nanotube bundle 22 can be either of single-walled carbon nanotubes and multi-walled carbon nanotubes. The density of the carbon nanotubes contained in each carbon nanotube bundles 22 is preferably above $1\times10^{10}$ tubes/cm$^2$ in terms of the heat radiation and electric conductivity. The length of the carbon nanotubes is determined depending on applications of the carbon nanotube sheet 10 and is not especially limited. The length of the carbon nanotubes can be set preferably at about 5-500 μm.

The material of the coating films 14 formed on both surfaces of the carbon nanotube sheet 10 is not especially limited as long as the material has a high thermal conductivity of, e.g., not less than 1 (W/m·K). The material having a thermal conductivity of not less than 1 (W/m·K) is based on that the thermal conductivity has a sufficiently higher than the thermal conductivity of the general resin materials (about 0.1 (W/m·K)). When the carbon nanotube sheet 10 is used for electric conduction, materials having electric conductivity, e.g., metals, alloys, etc. can be used. As the constituent material of the coating films 14, for example, copper (Cu), nickel (Ni), gold (Au), indium (In) low melting point solder, etc. can be used. The coating film 14 may not essentially have a single layer structure and may have a layer structure of two layers, or three or more layers, e.g., the layer structure of titanium (Ti) and gold (Au).

As described above, in the carbon nanotube sheet 10 according to the present embodiment, the carbon nanotube bundles 22 are oriented, directed from the side of one surface of the sheet toward the side on the other surface of the sheet. Accordingly, the carbon nanotube sheet which sufficiently exhibits the property of the carbon nanotubes that the thermal conductivity and the electric conductivity in the direction of the orientation are high and has good thermal conductivity and electric conductivity in the direction of the film thickness of the sheet can be realized. The carbon nanotubes have also electric conductivity and can be used also as interconnections passed through the sheet. That is, the carbon nanotube sheet according to the present embodiment can be used not only as a heat conductive sheet, but also as a vertical interconnecting sheet.

Furthermore, in the carbon nanotube sheet 10 according to the present embodiment, the oriented carbon nanotube bundles 22 are tilted in a direction intersecting the direction perpendicular to the sheet surface, and carbon nanotube bundles 22 neighboring in the direction of the tilt are in contact with each other near at least one ends. Thus, the thermal conductivity and the electric conductivity in the direction perpendicular to the sheet surface can be further improved, and the thermal conductivity and the electric conductivity in the direction parallel with the sheet surface can be also improved.

When a plurality of carbon nanotube bundles 22 are grown, all the carbon nanotube bundles 22 do not have always a uniform length. When the carbon nanotube bundles 22 vary in the length, long carbon nanotube bundles 22 alone contact with a mounted body, and there is a risk that the other carbon nanotube bundles 22 might not be used as a heat conductor and electric conductor.

The neighboring carbon nanotube bundles 22 are contacted with each other, whereby those of the carbon nanotube bundles 22 which are not in direct contact with a mounted body are caused to function as heat conductors and electric conductors indirectly via the other carbon nanotube bundles 22. The manufacturing method which will be described alter is used, whereby the uniformity of the height of the tilted carbon nanotube bundles 22 can be improved, and the contact area with a mounted body can be increased. Tilting the carbon nanotube bundles 22 has the effect of improving the density of the carbon nanotube bundles 22. Owing to such various effects, the thermal conductivity and the electric conductivity in the direction perpendicular to the sheet surface can be further improved.

The neighboring carbon nanotube bundles 22 are in contact with each other, whereby a path of the thermal conduction and the electric conduction via the carbon nanotube bundles 22 is formed also in the direction parallel with the sheet surface, and the thermal conductivity and the electric conductivity in the direction parallel with the sheet surface can be also improved.

The coating films 14 of high thermal conductivity is provided on both surfaces of the carbon nanotube sheet 10, whereby the contact area of the carbon nanotube sheet 10 with respect to a mounted body (heat generator or a heat radiator) can be increased in comparison with the contact area without the coating films 14. Thus, the thermal contact resistance between the carbon nanotube bundles 22 and a mounted body is decreased, and the thermal conductivity of the carbon nanotube sheet 10 can be increased.

The coating films 14 has the effect of increasing the contact area between the carbon nanotube bundles 22 and a mounted body and the effect of ensuring the connection between the neighboring carbon nanotube bundles 22. Thus, the coating film 14 is provided, whereby the thermal contact resistance and contact resistance between the carbon nanotube sheet with a mounted body can be decreased.

By using, as the coating film 14, a low melting point material, e.g., indium, low melting point solder or others, the coating film 14 can be reflowed after the carbon nanotube sheet 10 is contacted to the mounted body. Thus, concavities and convexities of the joint between the carbon nanotube sheet 10 and a mounted body can be filled by the coating films 14, and the thermal conductivity and the electric conductivity between them can be further improved.

In the carbon nanotube sheet 10 according to the present embodiment, the filling layer 16 is not formed, as is not in the fifth embodiment. This is because the coating film 14 is formed all over the surfaces, whereby the carbon nanotube bundles 22 (carbon nanotubes) can be supported by the coating film 14. The major role of the filling layer 16 is to support the carbon nanotube bundles, retaining the orientation. Accordingly, the filling layer 16 is not essential in the present embodiment, in which the carbon nanotube bundles 22 (carbon nanotubes) can be supported by the coating films 14. However, in the carbon nanotube sheet according to the present embodiment as well, the filling layer 16 may be formed.

The film thickness of the coating film 14 can be set suitably depending on characteristics, etc. required of the carbon nanotube sheet 10. In terms of supporting the carbon nanotube bundles 22, the film thickness is set preferably at not less than some pms.

Next, the method of manufacturing the carbon nanotube sheet according to the present embodiment will be explained with reference to FIGS. 17A to 19. The constituent materials of the respective constituent parts and the details of the manufacturing method are the same as those of the first embodiment.

First, the substrate 30 to be used as the base for forming the carbon nanotube sheet 10 is prepared.

Figure 17A:
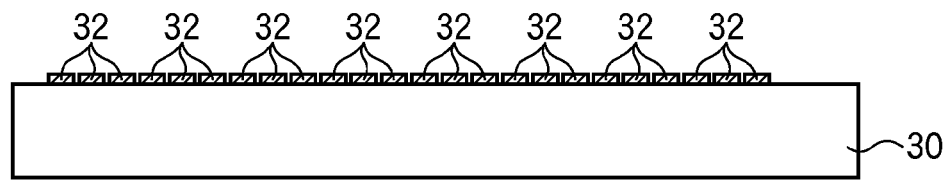
FIGS. 17A-17C and 18A-18C are diagrammatic sectional views illustrating a method of manufacturing the carbon nanotube sheet according to the sixth embodiment.
Figure 18A:
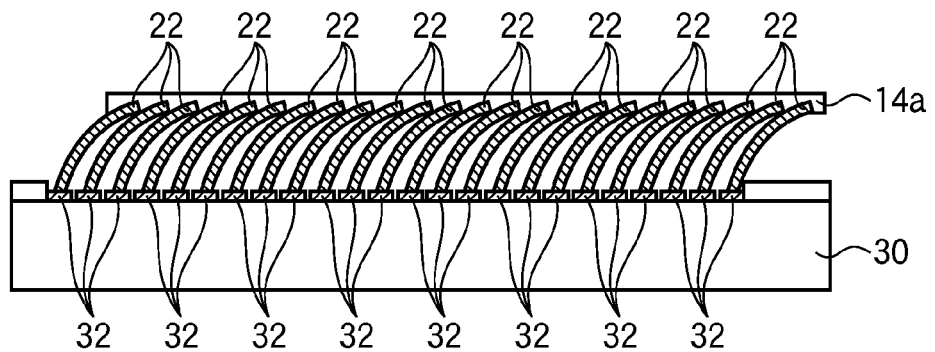

Then, over the substrate 30, the catalyst metal film 32 is selectively formed by, e.g., lift-off method using a photoresist film. The regions where the catalyst metal film 32 is formed are the regions for the carbon nanotube bundles 22 to be formed on (FIG. 17A). The method for forming the catalyst metal film 32 is not essentially limited to lift-off method. For example, a metal mask having openings in the regions for the carbon nanotube bundles 22 to be formed on may be used. With the substrate 30 having the surface covered with this metal mask, a catalyst metal is sputtered to form the catalyst metal film 32 selectively in the regions for the carbon nanotube bundles 22 to be formed in.

The plane layout of the catalyst metal film 32 is not especially limited. For example, as illustrated in FIG. 12A, the layout of closed-packed arrangement of circular regions for the carbon nanotube bundles 22 to be formed in can be used.

Figure 17B:
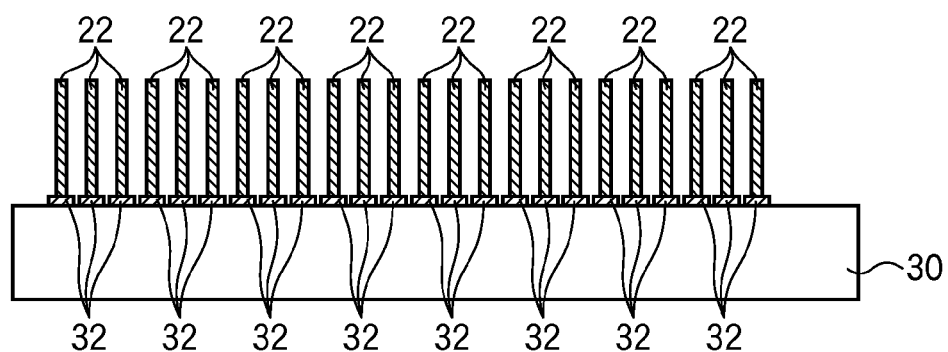

Next, over the substrate 30, the carbon nanotubes are grown by, e.g., hot filament CVD method with the catalyst metal film 32 used as the catalyst. Thus, on the regions of the substrate 20 where the catalyst metal film 32 is formed, the carbon nanotube bundles 22 containing a plurality of carbon nanotubes oriented in the direction of the normal of the substrate 30 (perpendicular orientation) are selectively formed (FIG. 17B).

Figure 17C:
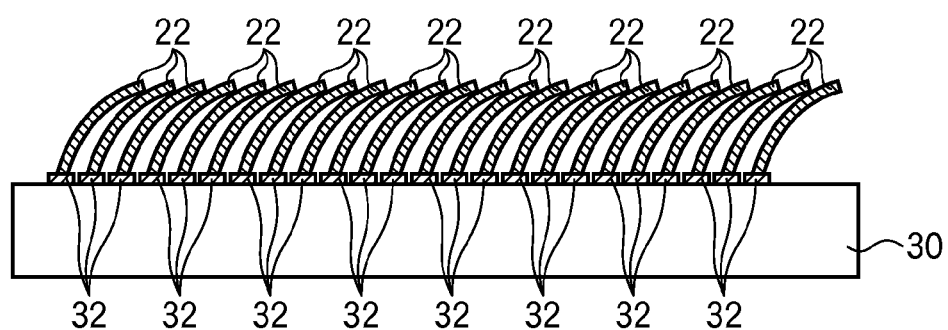

Then, the thus-grown carbon nanotube bundles 22 are tilted in a direction intersecting the direction perpendicular to the sheet surface (FIG. 17C).

In the present embodiment, to tilt the carbon nanotube bundles 22, an apparatus which can apply a uniform pressure to the surface of the substrate 30 and can shift the substrate 30 in the horizontal direction under the pressure is used. Such apparatus is not especially limited, but the flip chip bonder, for example, can be used. The method for tilting the carbon nanotube bundles 22 will be explained here by means of an example using the flip chip bonder.

First, the substrate 30 with the carbon nanotube bundles 22 grown on is placed on the stage 50 of the flip chip bonder (see FIG. 19).

Then, with the pressure head 52 of the flip chip bonder, the first pressure of about some N/cm$^2$ is applied from above the carbon nanotube bundles 22 perpendicularly to the surface of the substrate 30 (downward in the drawing) (see FIG. 19). The pressure head 52 has a surface parallel with the substrate 30 as exemplified in FIG. 19.

Then, with the first pressured being applied to the carbon nanotube bundles 22, the pressure head 52 is shifted in the first direction parallel with the surface of the substrate 30 (to the right in the drawing) by about tens microns, e.g., 30 µm (see FIG. 19).

Then, the pressure to be applied by the pressure head 52 is increased from the first pressure to the second pressure which is higher by about 10-50 N/cm$^2$ than the first pressured. At this time, to change the first pressure to the second pressure, the first pressure may be increased to the second pressure interruptedly or may be increased gradually in steps to the second pressure.

Next, with the second pressure being applied to the carbon nanotube bundles 22, the pressure head 52 is shifted by some millimeters, e.g., 2 mm in the first direction parallel with the surface of the substrate 30.

The application of the pressure to the carbon nanotube bundles 22 and the shift of the pressure head 52 are thus made, whereby the carbon nanotube bundles 22 are tilted in the first direction to cause the neighboring carbon nanotube bundles 22 to join each other.

In the method described above, the pressure to be applied to the carbon nanotube bundles 22 and the shift of the pressure head are made on two stages. This is for tilting the carbon nanotube bundles 22 to a required configuration while preventing the carbon nanotube bundles 22 from being broken.

When the pressure is applied perpendicularly with the carbon nanotube bundles 22 oriented perpendicularly, if the applied pressure is too strong, the carbon nanotube bundles 22 are often collapsed or fractured. Then, in the first stage, the pressure head 52 is pressed against the upper ends of the carbon nanotube bundles 22 with a pressure which does not break the carbon nanotube bundles 22 to be close contact with the carbon nanotube bundles 22. Then, in this state, the pressure head 52 is shifted horizontally to thereby a little tilt the carbon nanotube bundles 22. Because of the pressure head 52 contacting the upper ends of the carbon nanotube bundles 22, tilting the carbon nanotube bundles 22 has the effect of make uniform the carbon nanotube bundles 22 of various heights.

When the carbon nanotube bundles 22 are tilted, the pressure applied to the carbon nanotube bundles 22 is distributed, which makes it possible to apply high pressure without breaking the carbon nanotube bundles 22. Then, in the second stage, under the second pressure, which is higher than the first pressure, the pressure head 52 is pressed against the upper ends of the carbon nanotube bundles 22, and in this state, the pressure head is horizontally shifted to thereby tilt the carbon nanotube bundles 22 to a prescribed configuration.

The pressure to be applied to the carbon nanotube bundles 22, and the shift direction and the shift distance of the pressure head 52 can be controlled while monitoring with the flip chip bonder.

The inventors of the present application made a test on a sample comprising the carbon nanotube bundles 22 of carbon nanotubes formed in a 100 µm length and a $1\times10^{11}$/cm$^2$ area density, which are formed on the substrate 30 of a 2×3 cm$^2$ size by 63% of the area. As the first pressure, the pressure of some N/cm$^2$, e.g., 3 N/cm$^2$ was suitable. As the second pressure, the pressure of tens N/cm$^2$, e.g., 40 N/cm$^2$ was suitable.

Preferably, the first and the second pressures to be applied to the carbon nanotube bundles 22 are set suitable so as not to break the carbon nanotube bundles 22, depending on the length of the carbon nanotube bundles 22, the area density of the carbon nanotubes in the carbon nanotube bundles 22, the area density of the carbon nanotube bundles 22, etc. Preferably, the horizontal shift distance of the pressure head 52 is also set suitably depending on the horizontal shift distance of the pressure head 52, the length of the carbon nanotube bundles 22, the required tilt angle of the carbon nanotube bundles, etc.

In the above-explanation, to tilt the carbon nanotube bundles 22, the pressure head 52 is shifted, but the pressure head 52 may be shifted to be positioned relative to the substrate 30. That is, the pressure head 52 may be shifted with the stage 50 fixed, the stage 50 may be shifted with the pressure head 52 fixed, or the stage 50 and the pressure head 52 may be shifted in directions opposite to each other.

Then, after the carbon nanotube bundles 22 have been thus tilted, some µm-thickness indium (In) film, for example, is deposited over the carbon nanotube bundles 22 by, e.g., evaporation method. Thus, the In film is deposited over the carbon nanotube bundles 22 while the In film formed over the neighboring carbon nanotube bundles 22 joins each other, and the coating film 14a of In is formed all over the surface (FIG. 18A).

The constituent material of the coating film 14a is not especially limited as long as the material has high thermal conductivity. When the carbon nanotube sheet 10 is used for the electric conduction, materials of electric conductivity, e.g., metals, alloys, etc. can be used. As the constituent material of the coating film 14a, for example, copper (Cu), nickel (Ni), gold (Au), indium (In), low melting point solder, etc. can be used. The coating film 14a may have the single structure of these metals or the layer structure of two layers, or three or more layers, such as the above-described layer structure of titanium and gold.

Figure 18B:
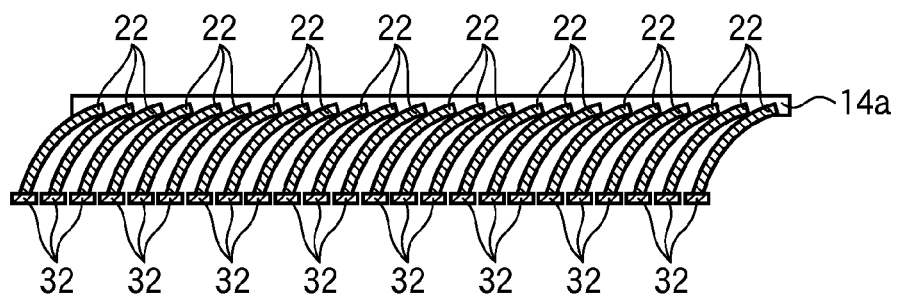
Figure 19:
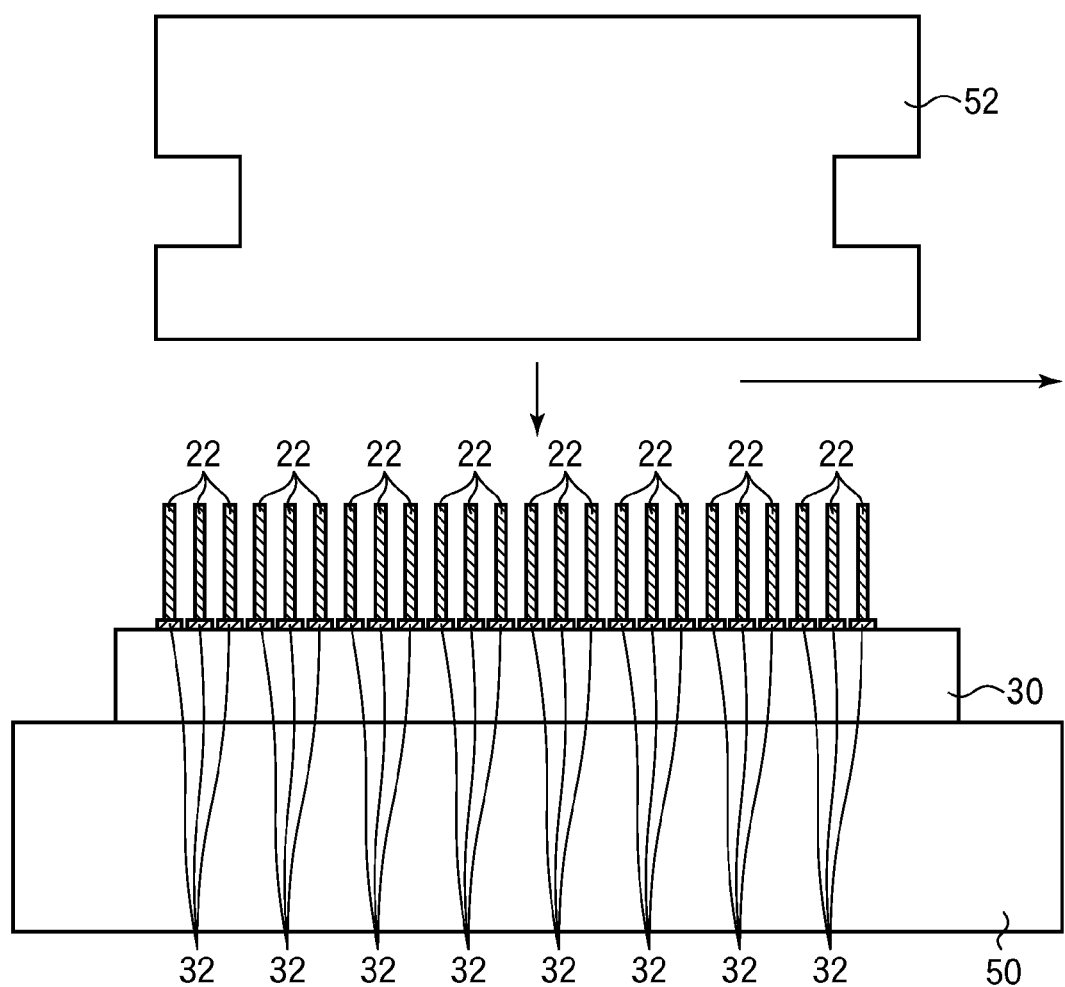
FIG. 19 is a diagrammatic view illustrating a method for tilting the carbon nanotube bundles according to the sixth embodiment.

Next, the carbon nanotube bundles 22 and the coating film 14a are peeled from the substrate 30 (FIG. 18B).

Then, over the surfaces of the carbon nanotube bundles 22, which have been peeled from the substrate 30, some μm-thickness indium (In) film, for example, is deposited by, e.g., evaporation method. Thus, the In film is deposited over the carbon nanotube bundles 22, and the In film formed over the neighboring carbon nanotube bundles 22 joins each other, and the coating film 14b of In is formed continuous all over the surface.

The constituent material of the coating film 14b is not especially limited as long as the material has high thermal conductivity. When the carbon nanotube sheet 10 is used for electric conduction, materials having electric conductivity, e.g., metals, alloys, etc. can be used. As the constituent material of the coating film 14b, for example, copper (Cu), nickel (Ni), gold (Au), indium (In), low melting pint solder, etc. can be used. The coating film 14b may have the single layer structure of these metals or the layer structure of two layers, or three or more layers, such as the above-described layer structure of titanium and gold, etc.

Figure 18C:
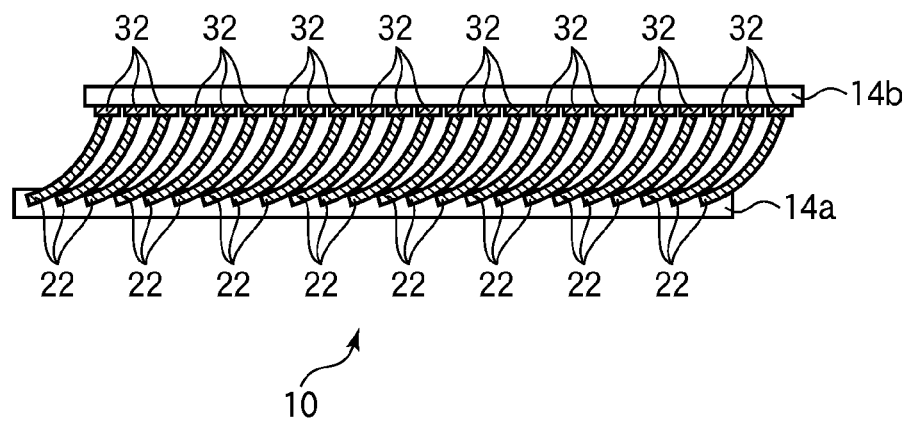

Thus, the carbon nanotube sheet 10 according to the present embodiment is completed (FIG. 18C).

In the drawing of the present embodiment, the catalyst metal layer 32 used in the growth is illustrated on the lower ends of the carbon nanotube bundles 22. The catalyst metal film 32 coheres in the growth of the carbon nanotubes to be taken into the carbon nanotubes. Actually, the catalyst metal film 32 does not remain in the illustrated state, and the carbon nanotube bundles 22 are exposed on the lower surface of the sheet. The catalyst metal film 32 is often removed simultaneously with peeling the substrate 30.

As described above, according to the present embodiment, the coating films of the material of high thermal conductivity is formed on the ends of the carbon nanotube bundles, whereby the thermal contact resistance and the contact resistance between the carbon nanotube bundles and a sheet mounted body can be drastically decreased. Thus, the heat conduction and the electric conduction of the carbon nanotube sheet can be improved. The carbon nanotube bundles are oriented from one surface of the sheet toward the other surface thereof, and the neighboring carbon nanotube bundles is joined, whereby the sheet of high heat conduction and high electric conduction in the direction perpendicular to the sheet surface and in the direction parallel to the sheet surface can be manufactured.

A Seventh Embodiment

The electronic device according to a seventh embodiment will be explained with reference to FIG. 20.

Figure 20:
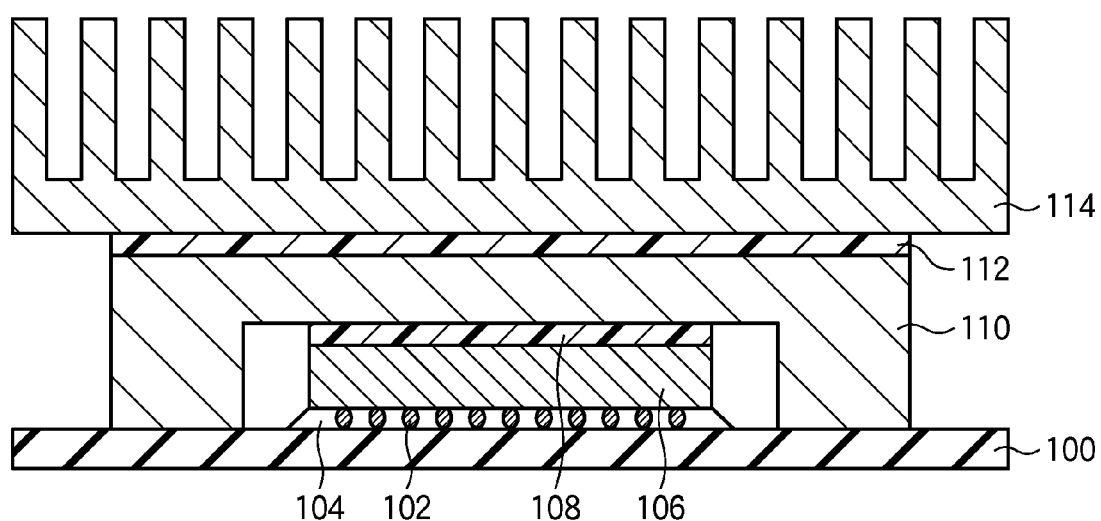
FIG. 20 is a diagrammatic sectional view illustrating a structure of the electronic device according to a seventh embodiment.

FIG. 20 is a diagrammatic sectional view of the electronic device according to the present embodiment, which illustrates the structure thereof.

In the present embodiment, the electronic device the carbon nanotube sheet according to any one of the first to the sixth embodiments is applied to as the heat conduction sheet will be explained.

On a circuit board 10, such as a multi-level interconnection circuit board or others, semiconductor element 106, etc., e.g., a CPU, etc. are mounted. The semiconductor element 106 is electrically connected to the circuit board 100 via solder bumps 102, and an under fill 104 is filled between the circuit board 100 and the semiconductor element 106.

On the semiconductor element 106, a heat spreader 110 for diffusing the heat from the semiconductor element 106 is formed, covering the semiconductor element 106. Between the semiconductor element 106 and the heat spreader 110, the carbon nanotube sheet 108 according to any one of the first to the sixth embodiments is formed.

On the heat spreader 110, a heat sink 114 for radiating the heat conducted to the heat spreader 110 is formed. Between the heat spreader 110 and the heat sink 114, the carbon nanotube sheet 112 according to any one of the first to the sixth embodiments is formed.

As described above, in the electronic device according to the present embodiment, the carbon nanotube sheets 108, 112 according to any one of the first to the sixth embodiments are provided respectively between the semiconductor element 106 and the heat spreader 110 and between the heat spreader 110 and the heat sink 114, i.e., between the heat generation unit and the heat radiation unit.

As described above, in the carbon nanotube sheet according to the first to the sixth embodiments, the carbon nanotubes are oriented perpendicularly to the film surface of the sheet, and have very high perpendicular heat conduction. The carbon nanotube sheet according to the fifth and the sixth embodiments has the coating films 14 formed on both surface, and can drastically decrease the thermal contact resistance.

Thus, the described carbon nanotube sheet is used as the heat conduction sheet between the semiconductor element 106 and the heat spreader 110 and between the heat spreader 110 and the heat sink 114, whereby the heat generated from the semiconductor element 106 can be efficiently spread horizontally while being conducted perpendicularly to the heat spreader 110 and the heat sink 114, whereby the heat radiation efficiently can be improved. Thus, the reliability of the electronic device can be improved.

As described above, according to the present embodiment, the carbon nanotube sheet according to the first to the sixth embodiments is arranged between the semiconductor element and the heat spreader and between the heat spreader and the heat sink, whereby the heat conduction between them can be drastically improved. Thus, the heat radiation efficiency of the heat generated from the semiconductor element can be increased, and the reliability of the electronic device can be improved.

An Eighth Embodiment

Figure 21:
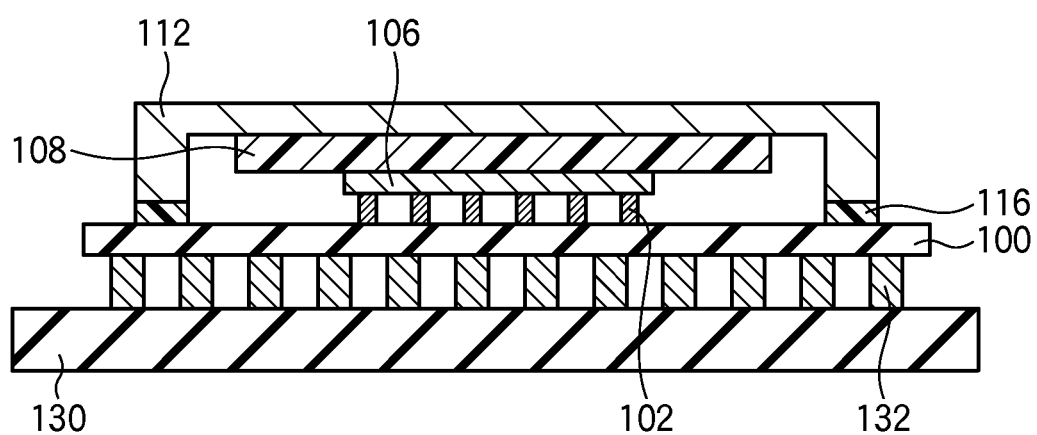
FIG. 21 is a diagrammatic sectional view illustrating a structure of the electronic device according to an eighth embodiment.

The electronic device according to an eighth embodiment will be explained with reference to FIG. 21.

FIG. 20 is a diagrammatic sectional view illustrating a structure of the electronic device according to the present embodiment.

In the present embodiment, the electronic device the carbon nanotube sheet according to any one of the first to the sixth embodiments is applied to as the heat conduction sheet will be explained.

Over a printed circuit board 130, a circuit board 100, such as a multi-level interconnection circuit board or others, is mounted. The circuit board 100 is electrically connected to the printed circuit board 130 via solder bumps 132.

On the circuit board 100, semiconductor element 106, e.g., a CPU, etc. are mounted. The semiconductor element 106 is electrically connected to the circuit board 100 via solder bumps 102.

On the semiconductor element 106, a heat spreader 110 for diffusing the heat from the semiconductor element 106 is formed, covering the semiconductor element 106. The carbon nanotube sheet 108 according to any one of the first to the sixth embodiments is formed between the semiconductor element 106 and the heat spreader 110. The heat spreader 110 is adhered to the circuit board 100 with, e.g., an organic sealant 116.

As described above, in the electronic device to the present embodiment, the carbon nanotube sheet 108 according to any one of the first to the sixth embodiments is provided between the semiconductor element 106 and the heat spreader 110, i.e., the heat generation unit and the heat radiation unit.

As described above, carbon nanotube sheet according to the first to the sixth embodiments, the carbon nanotubes are oriented perpendicularly to the film surface of the sheet, and the coating films 14 for decreasing the thermal contact resistance is formed on both ends. The heat conduction perpendicular to the surface is very high.

Accordingly, the described carbon nanotube sheet is used as the heat conduction sheet formed between the semiconductor element 106 and the heat spreader 110, whereby the heat generated from the semiconductor element 106 can be efficiently spread horizontally while being conducted perpendicularly to the heat spreader 110 and the heat sink 114, and the heat radiation efficiently can be improved. Thus, the reliability of the electronic device can be improved.

As the coating films 14 formed on both surfaces of the sheet, materials, such as indium and low melting point, solder whose melting points are lower than those of the materials of the other constituent parts of the electronic device, e.g., the solder bumps 102, 132 and the organic sealant 116 are used, whereby the heat radiation efficiency can be further increased.

That is, the coating films 14 are formed of a material having a low melting point, e.g., a low melting point material, e.g., indium, low melting point solder or others than the materials of the other constituent parts of the electronic device, whereby the coating film can be reflowed without damaging the other constituent parts. Thus, convexities and concavities of the interface between the semiconductor element 106 and the carbon nanotube sheet 108 and those of the interface between the carbon nanotube sheet 108 and the heat spreader 110 can be filled with the constituent material of the coating films 14, and the thermal contact resistance between them can be further decreased.

The thermal processing step for reflowing the coating films 14 can be made, e.g., after the heat spreader 110 has been adhered onto the circuit board 100 or after the circuit board 100 has been mounted on the printed board 130.

As described above, according to the present embodiment, the carbon nanotube sheet according to any one of the first to the sixth embodiments is provided between the semiconductor element and the heat spreader, whereby the heat conduction between them can be drastically improved. Thus, the heat radiation efficiency of the heat generated from the semiconductor element can be increased, the reliability of the electronic device can be improved.

A Ninth Embodiment

The electronic device according to a ninth embodiment will be explained with reference to FIG. 22.

Figure 22:
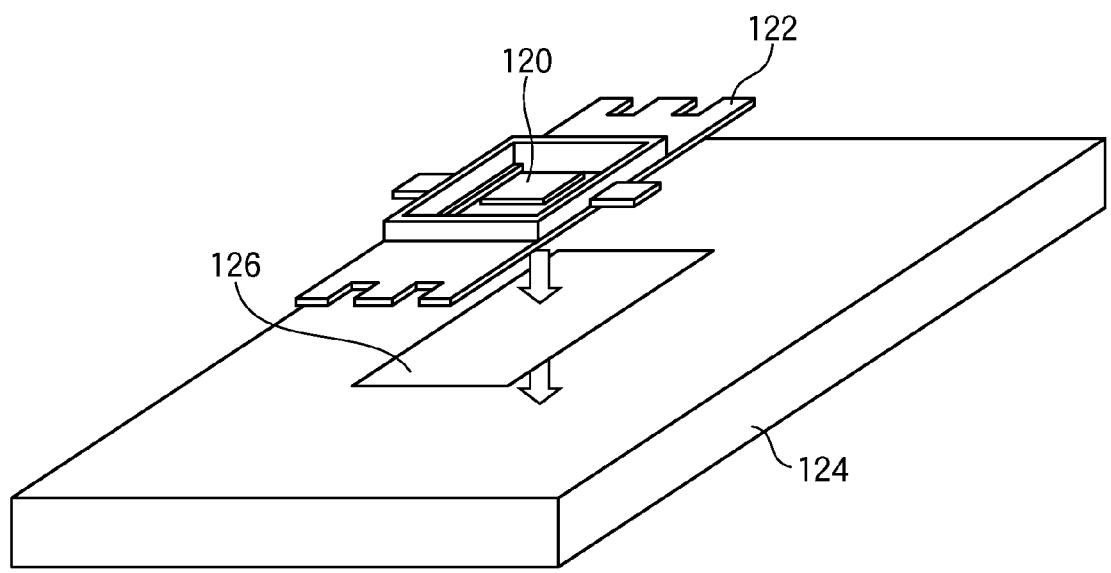
FIG. 22 is a perspective view illustrating a structure of the electronic device according to a ninth embodiment.

FIG. 22 is a perspective view illustrating a structure of the electronic device according to the present embodiment.

In the present embodiment, the electronic device using the carbon nanotube sheet according to any one of the first to the sixth embodiments as the heat conductive sheet which functions also the electric conductive sheet will be explained.

As illustrated in FIG. 22, the HPA (High Power Amplifier) 120 used in radio communication stations, etc. is incorporated in a package 122, and a heat sink 124 is jointed to the underside of the package 122. The heat generated from the HPA 120 is radiated to the heat sink 124 through the underside of the package 122. The package 122 is also used as the electric ground and must be electrically connected to the heat sink 124. To joint the package 122 and the heat sink 124, preferably, a good conductor for electricity and heat is used.

As illustrated in FIG. 22, at the joint between the package 122 and the heat sink 124, the carbon nanotube sheet 126 according to any one of the first to the sixth embodiments is used to thereby electrically connect the package 122 and the heat sink 124. The heat generated from the HPA 120 can be efficiently conducted to the heat sink 124, and the heat radiation efficiency can be improved. Thus, the reliability of the electronic device can be improved.

As described above, according to the present embodiment, the carbon nanotube sheet having carbon nanotubes oriented in the direction of the film thickness of the sheet is provided between the package of the HPA and the heat sink, whereby the thermal conductivity between them can be drastically improved. Thus, the heat radiation of the heat generated from the HPA can be improved, and the reliability of the electronic device can be increased. The HPA, and the heat sink as the ground can be electrically connected.

Modified Embodiments

The above-described embodiments can cover other various modifications.

For example, in the above-described embodiments, the sheet structure using the linear structure of carbon atoms is exemplified by carbon nanotube sheet using carbon nanotubes, but the sheet structure using the linear structure of carbon atoms is not limited to this. As the linear structure of carbon atoms, other than carbon nanotubes, carbon nanowires, carbon rods and carbon fibers are listed. These linear structures are the same as the carbon nanotubes except that they are different from the carbon nanotubes in size. The embodiments are applicable to the sheet structures using these linear structures.

In the first to the sixth embodiments described above, the coating films 14 are provided on both surfaces of the carbon nanotube sheet 10, but the coating film 14 may be formed only one surface of the carbon nanotube sheet 10. With the coating film 14 formed only one surface of the carbon nanotube sheet 10, when the carbon nanotube sheet 10 is used as head conduction sheet, it is preferable to arrange the carbon nanotube sheet 20 with the surface with the coating film 14 formed on positioned on the side of a heat generator. The carbon nanotube sheet 10 having the coating film 14 formed only one surface can be formed by filling the filling layer 16 and peeling the sheet from the substrate after the step of FIG. 5A.

In the first to the fourth embodiments described above, the filling layer 16 is formed between the carbon nanotubes 12 or between the carbon nanotube bundles 22, but the filling layer 16 may not be essentially formed. The filling layer 16 is mainly for supporting a plurality of carbon nanotubes 12 or a plurality of carbon nanotube bundles 22 to maintain the state of the sheet. Accordingly, for example, when the coating film 14 is formed continuous on the surface of the sheet and can sufficiently support the carbon nanotubes 12, the filing layer 16 may not be essentially formed.

In the sixth embodiment described above, the carbon nanotube bundles 22 are tilted. Also in the carbon nanotube sheet 10 having the carbon nanotubes 12 formed all over the surface as in, e.g., the first to the third embodiments and the fifth embodiment, the carbon nanotubes 12 may be tilted. The carbon nanotubes 12 can be tilted by, e.g., the method described in the sixth embodiment.

The constituent materials and the manufacturing conditions described in the embodiments described above are not essential and can be changed suitably in accordance with purposes, etc.

The uses of the carbon nanotube sheet are not limited to those described in the embodiments described above. The described carbon nanotube sheet is applicable, as the heat conduction sheet, to, e.g., the heat radiation sheet of CPUs, high power amplifiers of radio communication stations, high power amplifiers for radio communication terminals, high power switches for electric motors, servers, personal computers, etc. By utilizing the high allowable current density of the carbon nanotubes, the carbon nanotube sheet can be applicable to vertical interconnecting sheets and various applications using the vertical interconnection sheets.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. A sheet structure comprising:
   a plurality of carbon nanotubes, wherein each of the plurality of the carbon nanotubes includes a first end and a second end;
   a filling layer filled in gaps between the plurality of carbon nanotubes and supporting the plurality of carbon nanotubes; and
   a first coating film formed so as to be in contact with the first ends of the plurality of carbon nanotubes, and formed of a material having higher thermal conductivity than a constituent material of the filling layer,
   wherein a length of a region covered by the first coating film of each of the plurality of carbon nanotubes along a direction of an orientation of the plurality of carbon nanotubes is not less than 100 nm.

2. The sheet structure according to claim 1, wherein the first coating film joins the carbon nanotubes neighboring each other.

3. The sheet structure according to claim 1, further comprising:
   a graphite layer formed between the first coating film and the carbon nanotubes.

4. The sheet structure according to claim 1, further comprising:
   a second coating film formed on the second ends of the plurality of carbon nanotubes.

5. The sheet structure according to claim 1, wherein the plurality of carbon nanotubes are arranged at a first gap with each other and forming a plurality of carbon nanotube bundles arranged at a second gap with each other, which is larger than the first gap.

6. The sheet structure according to claim 1, wherein the plurality of carbon nanotubes are oriented in a direction of a film thickness of the sheet.

7. The sheet structure according to claim 1, wherein each of the plurality of carbon nanotubes are tilted with respect to the direction of a film thickness of the sheet, and the neighboring carbon nanotubes are in contact with each other.

8. The sheet structure according to claim 4, wherein the second coating film has a thermal conductivity of not less than 1 W/m·K.

9. An electronic device comprising:
   a heat generator;
   a heat radiator for radiating heat generating from the heat generator; and
   a sheet structure arranged between the heat generator and the heat radiator, the sheet structure including
     a plurality of carbon nanotubes, wherein each of the plurality of the carbon nanotubes includes a first end and a second end,
     a filling layer filled in gaps between the plurality of carbon nanotubes and supporting the plurality of carbon nanotubes, and
     a first coating film formed so as to be in contact with the first ends of the plurality of carbon nanotubes, and formed of a material having higher thermal conductivity than a constituent material of the filling layer,
     wherein a length of a region covered by the first coating film of each of the plurality of carbon nanotubes along a direction of an orientation of the plurality of carbon nanotubes is not less than 100 nm.

10. The electronic device according to claim 9, wherein the first coating film is formed, joining the neighboring carbon nanotubes with each other, and the plurality of carbon nanotubes are supported by the first coating film.

11. The electronic device according to claim 9, wherein the first coating film is formed of a material having a heat conductivity of not less than 1 W/m·K and joining the carbon nanotubes neighboring each other.

12. The electronic device according to claim 9, wherein the sheet structure further includes a graphite layer formed between the first coating film and the carbon nanotubes.

13. The electronic device according to claim 9, wherein the sheet structure further includes a second coating film formed on the second ends of the plurality of carbon nanotubes.

14. The electronic device according to claim 9, wherein the plurality of carbon nanotubes are arranged at a first gap with each other and forming a plurality of carbon nanotube bundles arranged at a second gap with each other, which is larger than the first gap.

15. The electronic device according to claim 9, wherein the plurality of carbon nanotubes are oriented in a direction of a film thickness of the sheet.

16. The electronic device according to claim 9, wherein each of the plurality of carbon nanotubes are tilted with respect to the direction of a film thickness of the sheet, and the neighboring carbon nanotubes are in contact with each other.

17. The electronic device according to claim 13, wherein the second coating film has a thermal conductivity of not less than 1 W/m·K.

18. The sheet structure according to claim 1, wherein the first coating film includes an electrical conductive material.

19. The sheet structure according to claim 1, wherein the first coating film is formed above the filling layer.

\* \* \* \* \*